United States Patent
Sekine et al.

(10) Patent No.: US 8,698,219 B2
(45) Date of Patent: Apr. 15, 2014

(54) SEMICONDUCTOR MEMORY DEVICE HAVING A LOW OFF STATE CURRENT AND HIGH REPEATABILITY

(75) Inventors: Yusuke Sekine, Kanagawa (JP); Yutaka Shionoiri, Kanagawa (JP); Kiyoshi Kato, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 395 days.

(21) Appl. No.: 13/004,200

(22) Filed: Jan. 11, 2011

(65) Prior Publication Data

US 2011/0175083 A1 Jul. 21, 2011

(30) Foreign Application Priority Data

Jan. 15, 2010 (JP) .................................. 2010-007494

(51) Int. Cl.
*H01L 27/108* (2006.01)
*H01L 29/94* (2006.01)

(52) U.S. Cl.
USPC ........... 257/298; 257/296; 257/300; 257/303; 257/304; 257/68

(58) Field of Classification Search
USPC ............. 257/68, 71, 296, 298, 300, 303, 304, 257/307, 312, 322, 319
See application file for complete search history.

(56) References Cited

U.S. PATENT DOCUMENTS

| | | | |
|---|---|---|---|
| 4,466,081 A | 8/1984 | Masuoka | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Chuong A Luu
*Assistant Examiner* — Cory Eskridge
(74) *Attorney, Agent, or Firm* — Fish & Richardson P.C.

(57) ABSTRACT

A semiconductor device has a non-volatile memory cell including a write transistor which includes an oxide semiconductor and has small leakage current in an off state (off-state current) between a source and a drain, a read transistor including a semiconductor material different from that of the write transistor, and a capacitor. Data is written or to the memory cell by applying a potential to a node where one of a source electrode and drain electrode of the write transistor, one electrode of the capacitor, and a gate electrode of the read transistor are electrically connected to one another so that the predetermined amount of charge is held in the node. The memory window width is changed by 2% or less, before and after $1\times10^9$ times of writing.

16 Claims, 19 Drawing Sheets

(56) References Cited

U.S. PATENT DOCUMENTS

| | | | |
|---|---|---|---|
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi et al. |
| 2011/0116310 | A1* | 5/2011 | Yamazaki et al. ............ 365/182 |

FOREIGN PATENT DOCUMENTS

| | | | |
|---|---|---|---|
| JP | 57-105889 | A | 7/1982 |
| JP | 60-198861 | A | 10/1985 |
| JP | 62-230043 | A | 10/1987 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | A | 5/1999 |
| JP | 2000-044236 | A | 2/2000 |
| JP | 2000-150900 | A | 5/2000 |
| JP | 2002-076356 | A | 3/2002 |
| JP | 2002-093924 | A | 3/2002 |
| JP | 2002-289859 | A | 10/2002 |
| JP | 2002-368226 | A | 12/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| WO | 2004/114391 | A1 | 12/2004 |

OTHER PUBLICATIONS

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Hayashi, R et al., "42.1: Invited Paper: Improved Amorphous In—Ga—Zn—O TFTS," SID Digest '08 : SID Internatinal Symposium Digest of Technical Papers, May 20, 2008, vol. 39, pp. 621-624.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

(56) References Cited

OTHER PUBLICATIONS

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000°C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

(56) References Cited

OTHER PUBLICATIONS

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Na, J et al., "High Field-Effect Mobility Amorphous InGaZnO Transistors with Aluminum Electrodes," Appl. Phys. Lett. (Applied Physics Letters), 2008, vol. 93, No. 6, pp. 063501-1-063501-3.

Nakamura, "Synthesis of Homologous Compound with New Long-Period Structure," Nirim Newsletter, Mar. 1995, vol. 150, pp. 1-4 with English translation.

Nakamura, M et al., "The phase relations in the $In_2O_3$—$Ga_2ZnO_4$—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters) , Sep. 13, 2004, vol. 85, No. 11, pp. 1993-1995.

Nowatari. H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)_m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo ($Ga_2O_3$-$In_2O_3$-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2010/073875, dated Apr. 12, 2011, 4 pages.

Written Opinion, PCT Application No. PCT/JP2010/073875, dated Apr. 12, 2011, 4 pages.

* cited by examiner

SEMICONDUCTOR MEMORY DEVICE HAVING A LOW OFF STATE CURRENT AND HIGH REPEATABILITY

TECHNICAL FIELD

The disclosed invention relates to a semiconductor device using a semiconductor element and a manufacturing method thereof.

BACKGROUND ART

Memory devices using semiconductor elements are broadly classified into two categories: a volatile device that loses stored data when not powered, and a non-volatile device that holds stored data even when not powered.

A typical example of a volatile memory device is a dynamic random access memory (DRAM). A DRAM stores data in such a manner that a transistor included in a memory element is selected and charge is accumulated in a capacitor.

Owing to the above principle, charge in a capacitor is lost when data in a DRAM is read out; thus, another writing operation is necessary every time data is read out. Moreover, since leakage current (off-state current) flows between a source and a drain of a transistor included in a memory element in an off state charge flows into or out even if the transistor is not selected, which makes a data (information) holding period short. For that reason, another writing operation (refresh operation) is necessary at predetermined intervals, and it is difficult to adequately reduce power consumption. Furthermore, since stored data is lost when power supply stops, another memory device utilizing a magnetic material or an optical material is needed in order to hold the data for a long time.

Another example of a volatile memory device is a static random access memory (SRAM). An SRAM holds stored data by using a circuit such as a flip-flop and thus does not need refresh operation, which is an advantage over a DRAM. However, cost per capacity is increased because a circuit such as a flip-flop is used. Moreover, as in a DRAM, stored data in an SRAM is lost when power supply stops.

A typical example of a non-volatile memory device is a flash memory. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary in a volatile memory device is not needed (e.g., see Patent Document 1).

However, in a flash memory, there is a problem in that a memory element does not function after a predetermined number of writing operations because a gate insulating layer included in the memory element deteriorates due to tunneling current generated in writing operations. In order to reduce effects of this problem, a method in which the number of writing operations is equalized among the memory elements can be employed, for example, but a complicated peripheral circuit is needed to realize this method. Moreover, even when such a method is employed, the fundamental problem of lifetime is not resolved. In other words, a flash memory is not suitable for applications in which data is frequently rewritten.

In addition, high voltage is necessary for holding charge in the floating gate or removing the charge, and a circuit therefor is required. Further, it takes a relatively long time to inject or remove electric charge, and it is not easy to increase a speed of writing and erasing data.

REFERENCE

Patent Document 1: Japanese Published Patent Application No. S57-105889

DISCLOSURE OF INVENTION

In view of the foregoing problems, an object of one embodiment of the invention disclosed herein is to provide a semiconductor device with a novel structure in which stored data can be held even when power is not supplied, and the number of times of writing is not limited.

The invention disclosed in this specification and the like provides a semiconductor device having a non-volatile memory cell including a write transistor which includes an oxide semiconductor and has small leakage current in an off state (off-state current) between a source and a drain, a read transistor including a semiconductor material different from that of the write transistor, and a capacitor. Data is written or rewritten to the memory cell by turning on the write transistor and applying a potential to a node where one of a source electrode and drain electrode of the write transistor, one electrode of the capacitor, and a gate electrode of the read transistor are electrically connected to one another, and then turning off the write transistor so that the predetermined amount of charge is held in the node.

One embodiment of the disclosed invention is a semiconductor device including a non-volatile memory cell including a first transistor, a second transistor, and a capacitor. In the semiconductor device, the first transistor and the second transistor are formed using different semiconductor materials; the second transistor is formed using an oxide semiconductor; data is written to the memory cell by turning on the second transistor so that potential is applied to a node where one of a source electrode and drain electrode of the second transistor, a gate electrode of the first transistor, and one electrode of the capacitor are electrically connected to one another, and by turning off the second transistor so that charge is held in the node; data is read out from the memory cell by controlling a potential applied to the other electrode of the capacitor and by determining whether the first transistor is in an on state or an off state; and the memory window width is changed by 2% or less before and after $1\times10^9$ times of the writing.

Another embodiment of the disclosed invention is a semiconductor device includes a non-volatile memory cell including a first transistor; a second transistor; and a capacitor. In the semiconductor device, the first transistor and the second transistor are formed using different semiconductor materials; the second transistor is formed using an oxide semiconductor and has off-state current (here, current per micrometer (μm) of channel width) less than or equal to 100 zA/μm; data is written to the memory cell by turning on the second transistor so that potential is applied to a node where one of a source electrode and drain electrode of the second transistor, a gate electrode of the first transistor, and one electrode of the capacitor are electrically connected to one another, and by turning off the second transistor so that charge is held in the node; data is read out from the memory cell by controlling a potential applied to the other electrode of the capacitor and by determining whether the first transistor is in an on state or an off state; and the memory window width is changed by 2% or less before and after $1\times10^9$ times of the writing.

In the above semiconductor device, off-state current of the second transistor is preferably lower than off-state current of the first transistor.

In the above semiconductor device, a switching speed of the first transistor is higher than a switching speed of the second transistor.

In the above semiconductor device, the second transistor is formed using a material having an energy gap larger than 3 eV.

Note that although the write transistor having small off-state current is formed using an oxide semiconductor in the above description, the disclosed invention is not limited to this. A material which can realize the off-state current characteristics equivalent to those of the oxide semiconductor, such as a wide gap material (in which Eg>3 eV) like silicon carbide may be used.

Note that in this specification and the like, a non-volatile memory cell refers to a memory cell which can hold data for a certain period or longer (at least longer than or equal to $1 \times 10^4$ seconds, preferably longer than or equal to $1 \times 10^6$ seconds) even without power supply.

Note that in this specification and the like, the term such as "over" or "below" does not necessarily mean that a component is placed "directly over" or "directly below" another component. For example, the expression "a gate electrode over a gate insulating layer" does not exclude the case where another component is provided between the gate insulating layer and the gate electrode. Moreover, the terms such as "over" and "below" are only used for convenience of explanation and the positions can be interchanged unless otherwise specified.

In addition, in this specification and the like, the term such as "electrode" or "wiring" does not limit a function of a component. For example, an "electrode" is sometimes used as part of a "wiring", and vice versa. Further, the term "electrode" or "wiring" can include the case where a plurality of "electrodes" or "wirings" is formed in an integrated manner.

Further, functions of a "source" and a "drain" are sometimes interchanged with each other when a transistor of opposite polarity is used or when the direction of current flow is changed in circuit operation, for example. Therefore, the terms "source" and "drain" can be interchanged in this specification.

Note that in this specification and the like, the term "electrically connected" includes the case where components are connected through an object having any electric function. There is no particular limitation on the object having any electric function as long as electric signals can be transmitted and received between the components connected through the object.

Examples of the object having any electric function include a switching element such as a transistor, a resistor, an inductor, a capacitor, and an element with a variety of functions as well as an electrode and a wiring.

Since the off-state current of a transistor including an oxide semiconductor is extremely small, stored data can be held for an extremely long period by using the transistor. In other words, refresh operation becomes unnecessary or the frequency of the refresh operation can be extremely low, which leads to a sufficient reduction in power consumption. Moreover, stored data can be held for a long period even when power is not supplied.

Further, a semiconductor device according to the disclosed invention does not need high voltage for writing data, and deterioration of the element does not become a problem. For example, unlike a conventional non-volatile memory, it is not necessary to inject and extract electrons into and from a floating gate, and thus a problem such as deterioration of a gate insulating layer does not occur at all. That is, the semiconductor device according to the disclosed invention does not have a limit on the number of times of rewriting, which has been a problem of a conventional non-volatile memory, and thus has drastically improved reliability. Furthermore, since data is written by turning on or off the transistor, high-speed operation can be easily realized. Additionally, there is an advantage that operation for erasing data is not needed.

Since a transistor including a material which is not an oxide semiconductor can operate at sufficiently high speed, when it is combined with a transistor including an oxide semiconductor, a semiconductor device can perform operation (e.g., reading data) at sufficiently high speed. Further, a transistor including a material which is not an oxide semiconductor can suitably realize a variety of circuits (e.g., a logic circuit or a driver circuit) which needs to operate at high speed.

A semiconductor device having a novel feature can be realized by being provided with both the transistor including a semiconductor material which is not an oxide semiconductor and the transistor including an oxide semiconductor.

BEST MODE FOR CARRYING OUT THE INVENTION

Figure 1A:
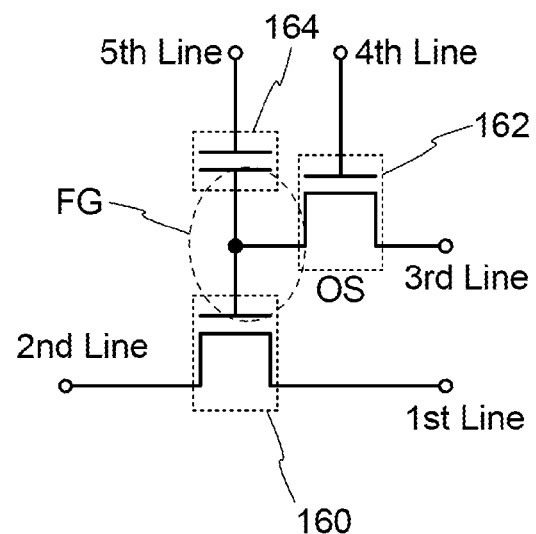
FIGS. 1A and 1B are circuit diagrams of a semiconductor device.

Hereinafter, embodiments of the present invention are described below with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments to be given below.

Note that the position, the size, the range, or the like of each structure illustrated in drawings and the like is not accurately represented in some cases for easy understanding. The disclosed invention is thus not necessarily limited by the position, size, range, or the like illustrated in the drawings and the like.

In this specification and the like, ordinal numbers such as first, second, and third are used in order to avoid confusion among components, and the terms do not limit the components numerically.

Embodiment 1

In this embodiment, a circuit structure and operation of a semiconductor device according to an embodiment of the disclosed invention will be described with reference to FIGS. 1A and 1B. Note that in each of the circuit diagrams, "OS" may be written beside a transistor in order to indicate that the transistor includes an oxide semiconductor.

A semiconductor device in FIG. 1A includes a non-volatile memory cell which includes a transistor 160, a transistor 162, and a capacitor 164. In FIG. 1A, one of a source electrode and drain electrode of the transistor 162, one electrode of the capacitor 164, and a gate electrode of the transistor 160 are electrically connected to one another. In addition, a first wiring (a 1st line, also referred to as a source line) and a source electrode of the transistor 160 are electrically connected to each other, and a second wiring (a 2nd line, also referred to as a bit line) and a drain electrode of the transistor 160 are electrically connected to each other. In addition, a third wiring (a 3rd line, also referred to as a first signal line) and the other of the source electrode and drain electrode of the transistor 162 are electrically connected to each other, and a fourth wiring (a 4th line, also referred to as a second signal line) and a gate electrode of the transistor 162 are electrically connected to each other. A fifth wiring (a 5th line, also referred to as a word line) and the other electrode of the capacitor 164 are electrically connected to each other.

Here, a transistor including an oxide semiconductor is used as the transistor 162. A transistor including an oxide semiconductor has extremely small off-state current. Therefore, when the transistor 162 is in an off state, a potential of a node (hereinafter, a node FG) where the one of the source electrode and drain electrode of the transistor 162, the one electrode of the capacitor 164, and the gate electrode of the transistor 160 are electrically connected to one another can be held for a very long period. The capacitor 164 facilitates holding of charge given to the node FG and reading of the held data.

There is no limitation on off-state current of the transistor 160; in order to increase the operation speed of the memory cell, a transistor with a higher switching speed (e.g., a higher field-effect mobility) than the transistor 162 is used as the transistor 160. In other words, a transistor including a semiconductor material which is not an oxide semiconductor is used as the transistor 160. Note that the off-state current of the transistor 160 may be larger than that of the transistor 162, depending on a selected semiconductor material. The semiconductor material for the transistor 160 can be silicon, germanium, silicon germanium, silicon carbide, gallium arsenide, or the like, and is preferably a single-crystal semiconductor. The transistor 160 including such a semiconductor material allows high-speed reading operation of stored data or the like.

In the semiconductor device illustrated in FIG. 1A, when data is stored in the memory cell (in writing of data), the potential of the fourth wiring is set to a potential at which the transistor 162 is turned on, whereby the transistor 162 is turned on. Thus, the potential of the third wiring is applied to the node FG and a predetermined amount of charge is accumulated in the node FG. Here, charge for applying either two different potential levels (hereinafter referred to as low-level charge and high-level charge) is given to the node FG. After that, the potential of the fourth wiring is set to a potential at which the transistor 162 is turned off, whereby the transistor 162 is turned off. This makes the node FG floating and the predetermined amount of charge is kept held in the node FG. The predetermined amount of charge is thus accumulated and held in the node FG, whereby the memory cell can store data.

Since the off-state current of the transistor 162 is extremely small, the charge applied to the node FG is held for a long period. This can remove the need of refresh operation or drastically reduce the frequency of the refresh operation, which leads to a sufficient reduction in power consumption. Moreover, stored data can be held for a long period even when power is not supplied.

When data stored in the memory cell is read out (in reading of data), while a predetermined potential (a fixed potential) is applied to the first wiring, an appropriate potential (a read-out potential) is applied to the fifth wiring, whereby the transistor 160 changes its state depending on the amount of charge held in the node FG. This is because in general, when the transistor 160 is an n-channel transistor, an apparent threshold value $V_{th\_H}$ of the transistor 160 in the case where the high-level charge is held in the node FG is lower than an apparent threshold value $V_{th\_L}$, of the transistor 160 in the case where the low-level charge is held in the node FG. Here, an apparent threshold value refers to the potential of the fifth line which is needed to turn on the transistor 160. Thus, by setting the potential of the fifth wiring to a potential $V_0$ which is between $V_{th\_H}$ and $V_{th\_L}$, charge held in the node FG can be determined. For example, in the case where the high-level charge is given in writing, when the potential of the fifth wiring is set to $V_0$ ($>V_{th\_H}$), the transistor 160 is turned on. In the case where the low-level charge is given in writing, even when the potential of the fifth wiring is set to $V_0$ ($<V_{th\_L}$), the transistor 160 remains off. In such a manner, by controlling the potential of the fifth wiring and determining whether the transistor 160 is in an on state or off state (reading out the potential of the second wiring), stored data can be read out.

Note that in the case where memory cells are arrayed, it is necessary to read out data only from an intended memory cell. In a memory cell whose data is not read out, a potential at which the transistor 160 is in an off state regardless of the state of the node FG, that is, a potential lower than $V_{th\_H}$, may be given to the fifth wiring; alternatively, a potential at which the transistor 160 is in an on state regardless of the state of the node FG, that is, a potential higher than $V_{th\_L}$, may be given to the fifth wiring.

Further, in order to rewrite data stored in a memory cell, a new potential is applied to the node FG which is holding the predetermined amount of charge given in the above writing, so that the charge of the new data is held in the node FG. Specifically, the potential of the fourth wiring is set to a potential at which the transistor 162 is turned on, whereby the transistor 162 is turned on. The potential of the third wiring (a potential of new data) is applied to the node FG, and the predetermined amount of charge is accumulated in the node FG. After that, the potential of the fourth wiring is set to a potential at which the transistor 162 is turned off, whereby the transistor 162 is turned off. Thus, charge of the new data is held in the node FG. In other words, while the predetermined amount of charge given in the first writing is held in the node FG the same operation (a second writing) as in the first writing is performed, whereby the data stored in the memory cell can be overwritten.

In the semiconductor device according to the disclosed invention, data can be directly rewritten by another writing of data as described above. Therefore, extracting of charge from a floating gate with high voltage, which is needed in a flash memory or the like, is not necessary and thus a reduction in operation speed caused by erasing operation, can be suppressed. In other words, high-speed operation of the semiconductor device can be realized. In addition, high voltage which is needed for writing or erasing data in a conventional floating-gate transistor is not necessary in the semiconductor device described in this embodiment.

Note that the source electrode and drain electrode of the transistor 162 is electrically connected to the gate electrode of the transistor 160, and thereby has an effect similar to that of a floating gate of a floating-gate transistor which is used as a non-volatile memory element. When the transistor 162 is in an off state, the node FG can be regarded as being embedded in an insulator (i.e., being in a floating state) and charge is held in the node FG. The off-state current of the transistor 162 including an oxide semiconductor is smaller than or equal to one hundred thousandth of the off-state current of a transistor including a silicon semiconductor or the like; thus, loss of the charge accumulated in the node FG due to leakage current of the transistor 162 is negligible. That is, with the transistor 162 including an oxide semiconductor, a non-volatile memory cell which can hold data without power supply can be realized.

For example, when the off-state current of the transistor 162 is 10 zA (1 zA (zeptoampere) is $1 \times 10^{-21}$ A) or less at room temperature and the capacitance value of the capacitor 164 is approximately 10 fF, data can be held for $10^4$ seconds or longer. It should be appreciated that the holding time changes depending on the transistor characteristics and the capacitance value.

In a conventional floating-gate transistor, since charge passes through a gate insulating film (a tunnel insulating film) in writing (rewriting) operation, deterioration of the gate insulating film (the tunnel insulating film) cannot be avoided. In the semiconductor device described in this embodiment, in contrast, charge merely travels between the third wiring and the node FG by switching operation of the transistor 162, and thus deterioration of the gate insulating film, which has been a problem, can be avoided. This means that there is no limit on the number of times of writing in principle and writing durability is very high.

The memory cell according to one embodiment of the present invention has very high writing durability, and thus can be used without the characteristics being affected even after $1 \times 10^9$ (a billion) or more times of writing. For example, before and after $1 \times 10^9$ times of writing, the memory window width, which is one of the indicators of the memory cell characteristics, is changed by only 2% or less, which is extremely small. Note that in this specification, the memory window width refers to the difference between $V_{th\_H}$ and $V_{th\_L}$; the $V_{th\_H}$ is the potential the fifth wiring needs to turn on the transistor 160, which is the read transistor, in the case where high-level charge is held in the node FG, and the $V_{th\_L}$ is the potential the fifth wiring needs to turn on the transistor 160, which is the read transistor, in the case where low-level charge is held in the node FG.

Figure 1B:
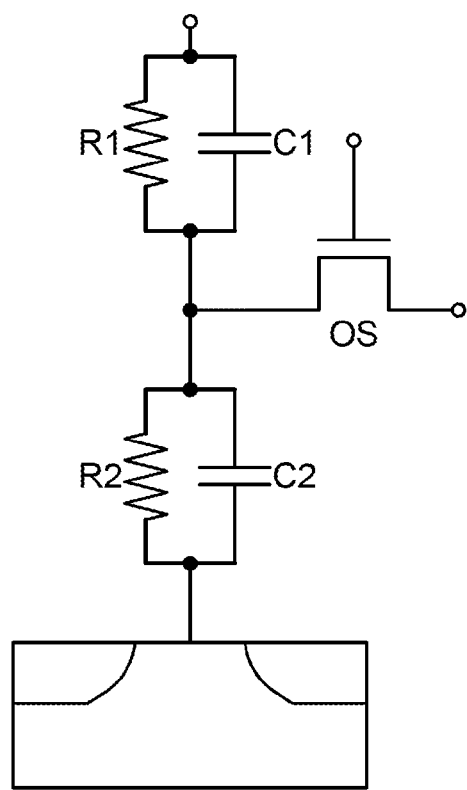

The components such as transistors in the semiconductor device in FIG. 1A can be regarded as including a resistor and a capacitor as shown in FIG. 1B. That is, in FIG. 1B, the transistor 160 and the capacitor 164 are each regarded as including a resistor and a capacitor. R1 and C1 denote the resistance value and the capacitance value of the capacitor 164, respectively. The resistance value R1 corresponds to the resistance value of an insulating layer included in the capacitor 164. R2 and C2 denote the resistance value and the capacitance value of the transistor 160, respectively. The resistance value R2 corresponds to the resistance value of a gate insulating layer at the time when the transistor 160 is on. The capacitance value C2 corresponds to the capacitance value of so-called gate capacitance (capacitance between the gate electrode and the source electrode and/or drain electrode and capacitance between the gate electrode and the channel formation region).

A charge holding period (also referred to as a data holding period) is determined mainly by off-state current of the transistor 162 under the condition where gate leakage of the transistor 162 is sufficiently small, R1 is greater than or equal to ROS, and R2 is greater than or equal to ROS which is the resistance value (also referred to as effective resistance) between the source electrode and the drain electrode at the time when the transistor 162 is off.

On the other hand, when the condition is not satisfied, it would be difficult to sufficiently secure the holding period even if the off-state current of the transistor 162 is small enough. This is because leakage current other than the off-state current of the transistor 162 (e.g., leakage current generated between the source electrode and the gate electrode) would be large. Thus, it can be said that the semiconductor device disclosed in this embodiment desirably satisfies the above relation.

It is desirable that C1 be larger than or equal to C2. When C1 is larger, variation in the potential of the fifth wiring can be suppressed when the potential of the node FG is controlled by the fifth wiring (e.g., at the time of reading).

When the above relation is satisfied, a more favorable semiconductor device can be realized. Note that R1 and R2 are determined by gate insulating layers of the transistor 160 and the transistor 162. Similarly, C1 and C2 are determined by the gate insulating layers of the transistor 160 and the transistor 162. Therefore, the material, the thickness, and the like of the gate insulating layers are desirably set as appropriate so that the above relation may be satisfied.

In the semiconductor device described in this embodiment, the node FG has an effect similar to a floating gate of a floating-gate transistor in a flash memory or the like, but the node FG of this embodiment has a feature which is essentially different from that of the floating gate in the flash memory or the like. In the case of a flash memory, since voltage applied to a control gate is high, it is necessary to keep a proper distance between cells in order to prevent the potential from affecting a floating gate of the adjacent cell. This is one of the factors inhibiting high integration of the semiconductor device. The factor is due to a basic principle of a flash memory that tunneling current is generated by application of a high electric field.

Further, because of the above principle of a flash memory, deterioration of an insulating film proceeds and causes another problem of a limit on the number of times of rewriting (approximately 10000 times).

The semiconductor device according to the disclosed invention is operated by switching of a transistor including an oxide semiconductor and does not use the above principle of charge injection by tunneling current. That is, unlike a flash memory, a high electric field for charge injection is not necessary. Accordingly, an influence of a high electric field for a control gate on an adjacent cell does not need to be taken into account, and thus the distance between cells can be reduced and high integration can be facilitated.

Further, since the principle of charge injection by tunneling current is not employed, there is no cause for deterioration of a memory cell. That is, the semiconductor device according to the disclosed invention has higher durability and reliability than a flash memory.

In addition, it is also advantage over a flash memory that a high electric field is unnecessary and a large peripheral circuit (such as a booster circuit) is unnecessary.

In the case where the dielectric constant $\in r1$ of the insulating layer included in the capacitor 164 is different from the dielectric constant $\in r2$ of the insulating layer included in the transistor 160, C1 can easily be made greater than or equal to C2 while S1 which is the area of the insulating layer included in the capacitor 164 and S2 which is the area an insulating layer forming gate capacitance of the transistor 160 satisfy the relation where $2 \times S2$ is greater than or equal to S1 (desirably, while S2 is greater than or equal to S1). In other words, C1 can easily be made greater than or equal to C2 while the area of the insulating layer included in the capacitor 164 is small. Specifically, for example, when a film formed of a high dielectric (high-k) material such as hafnium oxide or a stack of a film formed of a high dielectric (high-k) material such as hafnium oxide and a film formed of an oxide semiconductor is used for the insulating layer included in the capacitor 164, $\in r1$ can be set to 10 or more, preferably 15 or more; and when a film formed of silicon oxide is used for the insulating layer forming the gate capacitance, $\in r2$ can be set to 3 to 4.

Combination of such structures enables higher integration of the semiconductor device according to the disclosed invention.

Note that an n-channel transistor (an n-type transistor) in which electrons are majority carriers is used in the above description, but it will be appreciated that a p-channel transistor (a p-type transistor) in which holes are majority carriers can be used instead of the n-channel transistor.

As described above, a semiconductor device according to an embodiment of the disclosed invention has a non-volatile memory cell including a write transistor in which leakage current (off-state current) between a source and a drain in an off state is small, a read transistor including a semiconductor material different from that of the write transistor, and a capacitor.

The off-state current of the write transistor is preferably 100 zA ($1 \times 10^{-19}$ A) or less, more preferably 10 zA ($1 \times 10^{-20}$ A) or less, still more preferably 1 zA ($1 \times 10^{-21}$ A) or less at a temperature at which the memory cell is used (e.g., 25° C.). Such small off-state current is difficult to obtain with a general silicon semiconductor, but can be achieved by a transistor which is obtained by processing an oxide semiconductor under an appropriate condition. Therefore, it is preferable that a transistor including an oxide semiconductor be used as the write transistor.

In addition, a transistor including an oxide semiconductor has a small subthreshold swing (S value), so that the switching speed can be sufficiently high even if mobility is relatively low. Therefore, by using the transistor as the write transistor, rising of a writing pulse given to the node FG can be very sharp. Further, since off-state current of the transistor is small, the amount of charge held in the node FG can be reduced.

That is, by using a transistor including an oxide semiconductor as a write transistor, data can be rewritten at high speed.

As for the read transistor, although there is no limitation on off-state current, it is preferable to use a transistor which operates at high speed in order to increase the reading speed. For example, it is preferable to use a transistor with a switching speed of 1 nanosecond or faster as the read transistor.

Data is written to the memory cell by turning on the write transistor and applying a potential to a node where one of a source electrode and drain electrode of the write transistor, one electrode of the capacitor, and a gate electrode of the read transistor are electrically connected to one another, and then turning off the write transistor so that the predetermined amount of charge is held in the node. Since the off-state current of the write transistor is extremely small, the charge applied to the node is held for a long period of time. When off-state current is, for example, substantially 0, refresh operation needed for a conventional DRAM becomes unnecessary or the frequency of refresh operation can be significantly low (for example, about once a month or a year). Accordingly, power consumption of a semiconductor device can be adequately reduced.

Further, data can be rewritten directly by overwriting of new data to the memory cell. For that reason, erasing operation which is needed in a flash memory or the like is not needed, whereby a reduction in operation speed caused by erasing operation, can be suppressed. In other words, high-speed operation of the semiconductor device can be realized. Moreover, high voltage which has been needed in a conventional floating-gate transistor to write and erase data becomes unnecessary; thus, power consumption of the semiconductor device can be further reduced. The maximum value of voltage applied to the memory cell according to this embodiment (the difference between the highest potential and the lowest potential applied to terminals of the memory cell at the same time) can be 5 V or lower, preferably 3 V or lower, in each memory cell in the case where data of two stages (one bit) is written.

The memory cell provided in the semiconductor device according to the disclosed invention may include at least the write transistor, the read transistor, and the capacitor. Further, the memory cell can operate even when the area of the capacitor is small. Accordingly, the area of each memory cell can be sufficiently small as compared to, for example, an SRAM which requires six transistors in each memory cell; thus, the memory cells can be arranged in a semiconductor device at high density.

In a conventional floating-gate transistor, since charge travels in a gate insulating film (a tunnel insulating film) in writing operation, deterioration of the gate insulating film (the tunnel insulating film) cannot be avoided. In the memory cell according to one embodiment of the present invention, in contrast, data is written by holding predetermined amount of charge in the node by switching operation of the write transistor, and thus deterioration of the gate insulating film, which has been a problem, can be avoided. This means that there is no limit on the number of times of writing in principle and writing durability is very high. For example, it is possible to make the memory window width be changed by 2% or less before and after $1 \times 10^9$ times of writing, in the memory cell according to one embodiment of the present invention.

Further, in the case of using a transistor including an oxide semiconductor as the write transistor of the memory cell, the current-voltage characteristic of the memory cell is not degraded even at a high temperature of, for example, 150° C. because an oxide semiconductor has a wide energy gap of 3.0 eV to 3.5 eV and includes extremely few thermally excited carriers.

As a result of intensive research, the present inventors have succeeded in finding for the first time that a transistor including an oxide semiconductor has excellent characteristics in that the characteristics are not deteriorated even at a high temperature of 150° C. and that off-state current is 100 zA, which is extremely small, at room temperature. An embodiment of the disclosed invention is to provide a semiconductor device having a novel feature by using a transistor having such excellent characteristics as the write transistor of the memory cell.

The structures, methods, and the like described in this embodiment can be combined as appropriate with any of the structures and methods described in the other embodiments.

Embodiment 2

In this embodiment, an application example of the semiconductor device described in the above embodiment will be described with reference to FIGS. 2A and 2B and FIGS. 3A and 3B.

Figure 2A:
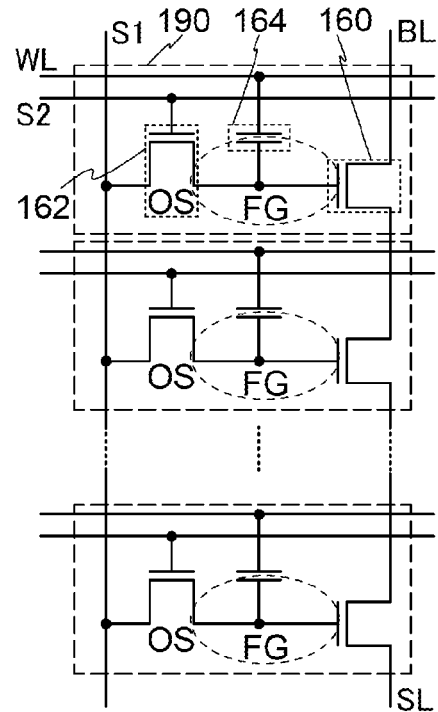
FIGS. 2A and 2B are circuit diagrams of a semiconductor device.
Figure 2B:
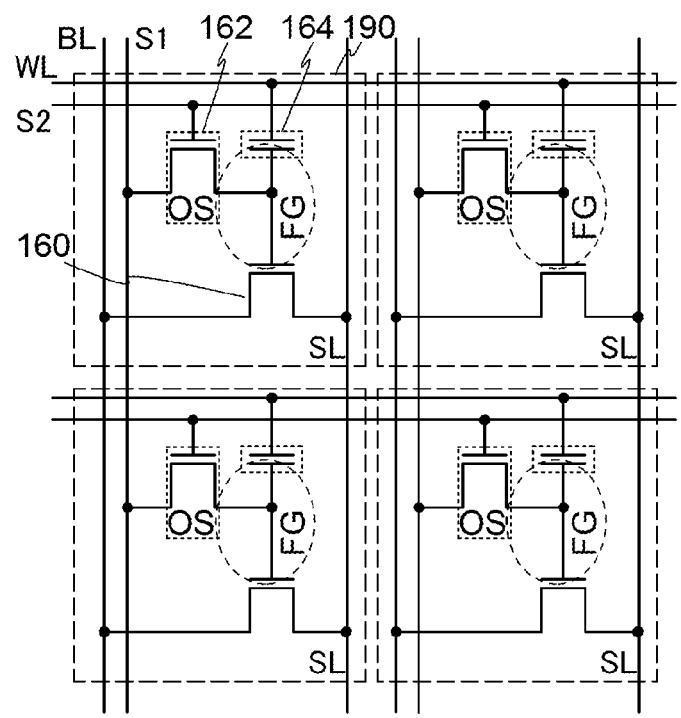

FIGS. 2A and 2B are circuit diagrams of semiconductor devices each including a plurality of semiconductor devices (hereinafter also referred to as memory cells 190) illustrated in FIG. 1A. FIG. 2A is a circuit diagram of a so-called NAND semiconductor device in which the memory cells 190 are connected in series, and FIG. 2B is a circuit diagram of a so-called NOR semiconductor device in which the memory cells 190 are connected in parallel.

The semiconductor device in FIG. 2A includes a source line SL, a bit line BL, a first signal line S1, a plurality of second signal lines S2, a plurality of word lines WL, and a plurality of memory cells 190. In FIG. 2A, one source line SL and one bit line BL are provided, but this embodiment is not limited to this. A plurality of source lines SL and a plurality of bit lines BL may be provided.

In the each memory cell 190, the gate electrode of the transistor 160, the one of the source electrode and drain electrode of the transistor 162, and the one electrode of the capacitor 164 are electrically connected to one another. In addition, the first signal line S1 and the other of the source electrode and drain electrode of the transistor 162 are electrically connected to each other, and the second signal line S2 and the gate electrode of the transistor 162 are electrically connected to each other. The word line WL and the other electrode of the capacitor 164 are electrically connected to each other.

Further, the source electrode of the transistor 160 in the memory cell 190 is electrically connected to the drain electrode of the transistor 160 in one adjacent memory cell 190. The drain electrode of the transistor 160 included in the memory cell 190 is electrically connected to the source electrode of the transistor 160 in another adjacent memory cell 190. Note that the drain electrode of the transistor 160 included in the memory cell 190 at one end of the plurality of memory cells connected in series is electrically connected to the bit line. In addition, the source electrode of the transistor 160 included in the memory cell 190 at the other end of the plurality of memory cells connected in series is electrically connected to the source line.

In the semiconductor device in FIG. 2A, writing operation and reading operation are performed for each row. The writing operation is performed as follows. A potential at which the transistor 162 is turned on is applied to the second signal line S2 of a row where writing is to be performed, whereby the transistor 162 of the row where writing is to be performed is turned on. Accordingly, a potential of the first signal line S1 is applied to the gate electrode of the transistor 160 of the specified row, whereby predetermined charge is given to the gate electrode. Thus, data can be written to the memory cell of the specified row.

The reading operation is performed as follows. First, a potential at which the transistors 160 are turned on regardless of the charge in the gate electrodes of the transistors 160 is applied to the word lines WL of rows other than a row where reading is to be performed, whereby the transistors 160 of the rows other than the row where reading is to be performed are turned on. Then, a potential (a read-out potential) at which an on state or an off state of the transistor 160 is determined depending on the charge in the gate electrode of the transistor 160 is applied to the word line WL of the row where reading is performed. After that, a fixed potential is applied to the source line SL and a read-out circuit (not illustrated) connected to the bit line BL is operated. Here, since the plurality of transistors 160 between the source line SL and the bit line BL are in an on state except the transistor 160 of the row where reading is performed, conductance between the source line SL and the bit line BL is determined by the state of the transistor 160 of the row where reading is performed. That is, a potential of the bit line BL which is read out by the read-out circuit changes depending on the charge in the gate electrode of the transistor 160 of the row where reading is performed. Thus, data can be read out from to the memory cell of the specified row.

The semiconductor device in FIG. 2B includes a plurality of source lines SL, a plurality of bit lines BL, a plurality of first signal lines S1, a plurality of second signal lines S2, a plurality of word lines WL, and a plurality of memory cells 190. The gate electrode of the transistor 160, the one of the source electrode and drain electrode of the transistor 162, and the one electrode of the capacitor 164 are electrically connected to one another. In addition, the source line SL and the source electrode of the transistor 160 are electrically connected to each other, and the bit line BL and the drain electrode of the transistor 160 are electrically connected to each other. In addition, the first signal line S1 and the other of the source electrode and drain electrode of the transistor 162 are electrically connected to each other, and the second signal line S2 and the gate electrode of the transistor 162 are electrically connected to each other. The word line WL and the other electrode of the capacitor 164 are electrically connected.

In the semiconductor device in FIG. 2B, writing operation and reading operation are performed for each row. The writing operation is performed in a manner similar to that of the semiconductor device in FIG. 2A. The reading operation is performed as follows. First, a potential at which the transistors 160 are turned off regardless of the charge in the gate electrodes of the transistors 160 is applied to the word lines WL of rows other than a row where reading is to be performed, whereby the transistors 160 of the rows other than the row where reading is to be performed are turned off. Then, a potential (a read-out potential) at which an on state or an off state of the transistor 160 is determined depending on the charge in the gate electrode of the transistor 160 is applied to the word line WL of the row where reading is performed. After that, a fixed potential is applied to the source line SL and a read-out circuit (not illustrated) connected to the bit line BL is operated. Here, conductance between the source line SL and the bit line BL is determined by the state of the transistor 160 of the row where reading is performed. That is, a potential of the bit line BL which is read out by the read-out circuit changes depending on the charge in the gate electrode of the transistor 160 of the row where reading is performed. Thus, data can be read out from to the memory cell of the specified row.

Next, examples of the read-out circuit which can be used for the semiconductor devices in FIGS. 2A and 2B, or the like will be described with reference to FIGS. 3A to 3C.

Figure 3A:
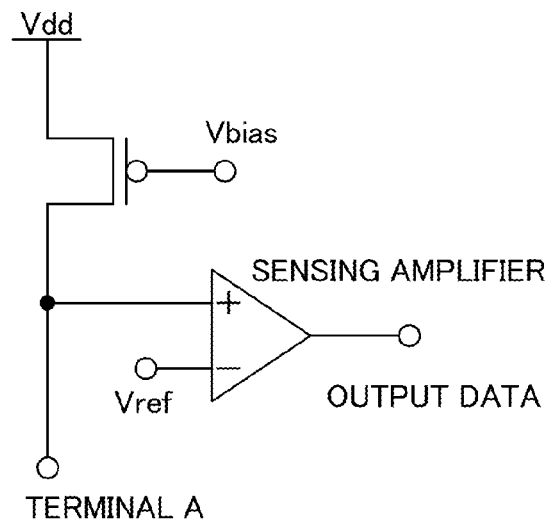
FIGS. 3A to 3C are circuit diagrams of a semiconductor device.

FIG. 3A is a schematic view of the read-out circuit. The read-out circuit includes a transistor and a sense amplifier circuit.

At the time of reading data, a terminal A is connected to a bit line to which a memory cell from which data is to be read is connected. Further, a bias potential Vbias is applied to a gate electrode of the transistor to control a potential of the terminal A.

The resistance of the memory cell 190 changes depending on stored data. Specifically, when the transistor 160 in the selected memory cell 190 is in an on state, the memory cell 190 has low resistance, whereas when the transistor 160 in the selected memory cell 190 is in an off state, the selected memory cell 190 has high resistance.

When the memory cell 190 has high resistance, the potential of the terminal A is higher than a reference potential Vref and the sense amplifier circuit outputs a potential (data "1") corresponding to the potential of the terminal A. On the other hand, when the memory cell 190 has low resistance, the potential of the terminal A is lower than the reference potential Vref and the sense amplifier circuit outputs a potential (data "0") corresponding to the potential of the terminal A.

Thus, with the read-out circuit, data can be read out from the memory cell 190. Note that the read-out circuit in this embodiment is an example, and another known circuit may be used. The read-out circuit may further include a precharge circuit. Instead of the reference potential Vref, a reference bit line may be connected to the sense amplifier circuit.

Figure 3B:
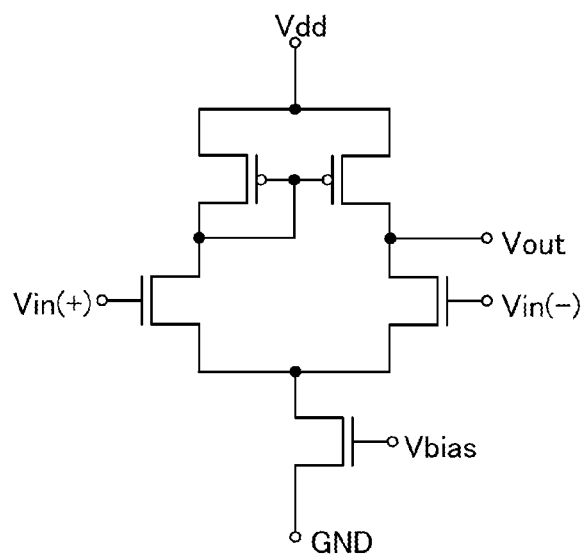

FIG. 3B illustrates a differential sense amplifier which is an example of a sense amplifier circuit. The differential sense amplifier has an input terminal Vin(+) and an input terminal Vin(−), and an output terminal Vout, and amplifies the difference between Vin(+) and Vin(−). When Vin(+)>Vin(−), output of the Vout is substantially High, whereas when Vin(+)<Vin(−), the output of the Vout is substantially Low. In the case where the differential sense amplifier is used for the read-out circuit, one of Vin(+) and Vin(−) is connected to the terminal A, and the reference potential Vref is applied to the other of Vin(+) and Vin(−).

Figure 3C:
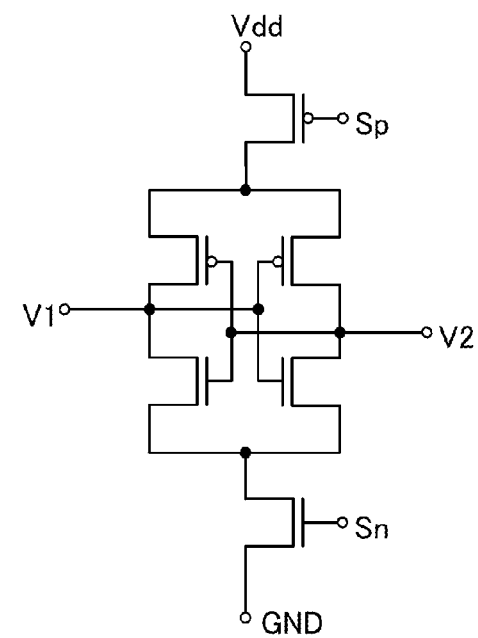

FIG. 3C illustrates a latch sense amplifier which is an example of a sense amplifier circuit. The latch sense amplifier includes an input/output terminal V1, an input terminal V2, an input terminal of a control signal Sp, and an input terminal of a control signal Sn. First, the control signals Sp and Sn are set to High and Low, respectively, and a power supply potential (Vdd) is cut off. Then, potentials to be compared are applied to V1 and V2. After that, the signals Sp and Sn are set to Low and High, respectively, and a power supply potential (Vdd) is applied. If the potentials V1in and V2in to be compared satisfy V1in>V2in, output of the V1 is High and output of the V2 is Low, whereas if the potentials satisfy V1in<V2in, the output of V1 is Low and the output of V2 is High. By utilizing such a relation, the difference between V1in and V2in can be amplified. When the latch sense amplifier is used for the read-out circuit, one of V1 and V2 is connected to the terminal A and the output terminal through a switch, and the reference potential Vref is applied to the other of V1 and V2.

The structures, methods, and the like described in this embodiment can be combined as appropriate with any of the structures and methods described in the other embodiments.

Embodiment 3

In this embodiment, a structure and manufacturing method of a semiconductor device according to an embodiment of the disclosed invention will be described with reference to FIGS. 7A and 7B, FIGS. 8A to 8H, and FIGS. 9A to 9E.

<Cross-Sectional Structure and Planar Structure of Semiconductor Device>

Figure 7A:
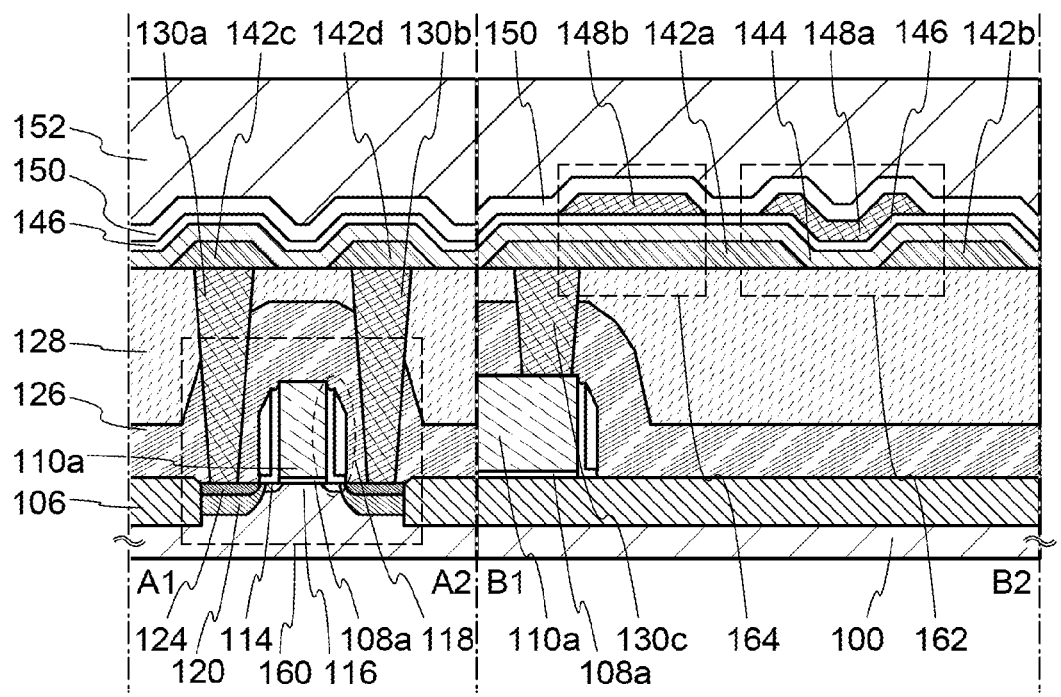
FIGS. 7A and 7B are a cross-sectional view and a plan view of a semiconductor device.
Figure 7B:
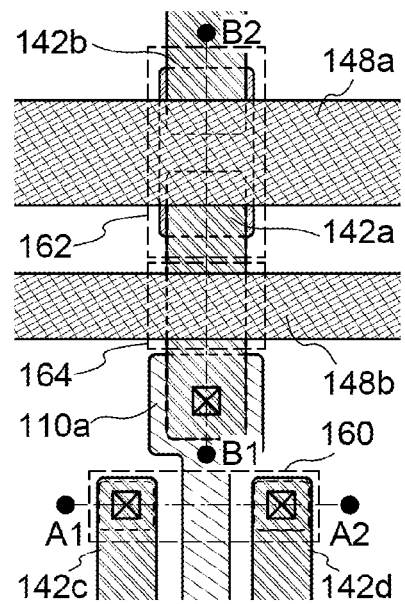

FIGS. 7A and 7B illustrate an example of a structure of a semiconductor device. FIG. 7A illustrates a cross section of the semiconductor device, and FIG. 7B illustrates a plan view of the semiconductor device. Here, FIG. 7A illustrates a cross section taken along line A1-A2 and line B1-B2 in FIG. 7B. The semiconductor device illustrated in FIGS. 7A and 7B includes the transistor 160 including a semiconductor material which is not an oxide semiconductor in a lower portion, and the transistor 162 including an oxide semiconductor in an upper portion. The transistor 160 including a semiconductor material which is not an oxide semiconductor can operate at high speed easily. On the other hand, the transistor 162 including an oxide semiconductor can hold charge for a long time because of its characteristics.

Although both of the transistors are n-channel transistors in this description, it should be appreciated that p-channel transistors can be used. Since the technical feature of the disclosed invention lies in the use of an oxide semiconductor in the transistor 162 in order to hold data, it is not necessary to limit a specific structure of the semiconductor device to the structure described here.

The transistor 160 in FIGS. 7A and 7B includes a channel formation region 116 provided in a substrate 100 including a semiconductor material (e.g., silicon), impurity regions 114 and high-concentration impurity regions 120 (these regions are also collectively referred to simply as impurity regions) provided so that the channel formation region 116 is sandwiched therebetween, a gate insulating layer 108a provided over the channel formation region 116, a gate electrode 110a provided over the gate insulating layer 108a, and a source or drain electrode 130a and a source or drain electrode 130b electrically connected to the impurity regions.

A sidewall insulating layer 118 is provided on a side surface of the gate electrode 110a. The high-concentration impurity region 120 is positioned in a region of the substrate 100 which does not overlap with the sidewall insulating layer 118 when seen in a direction perpendicular to the surface of the substrate 100. A metal compound region 124 is provided in contact with the high-concentration impurity region 120. The substrate 100 is provided with an element isolation insulating layer 106 which surrounds the transistor 160. An interlayer insulating layer 126 and an interlayer insulating layer 128 are provided so as to cover the transistor 160. Each of the source or drain electrode 130a and the source or drain electrode 130b is electrically connected to the metal compound region 124 through an opening formed in the interlayer insulating layer 126 and the interlayer insulating layer 128. Thus, each of the source or drain electrodes 130a and 130b is electrically connected to the high-concentration impurity region 120 and the impurity region 114 through the metal compound region 124. Further, an electrode 130c is electrically connected to the gate electrode 110a through an opening formed in the interlayer insulating layer 126 and the interlayer insulating layer 128. Note that the sidewall insulating layer 118 may be omitted in some cases for integration of the transistor 160 or the like.

The transistor 162 in FIGS. 7A and 7B includes a source or drain electrode 142a and a source or drain electrode 142b which are provided over the interlayer insulating layer 128; an oxide semiconductor layer 144 which is electrically connected to the source or drain electrode 142a and the source or drain electrode 142b; a gate insulating layer 146 which covers the source or drain electrode 142a, the source or drain electrode 142b, and the oxide semiconductor layer 144; and a gate electrode 148a which is provided over the gate insulating layer 146 so as to overlap with the oxide semiconductor layer 144.

Here, it is preferable that the oxide semiconductor layer 144 be highly purified by sufficient removal of impurities such as hydrogen and/or sufficient supply of oxygen. Specifically, the concentration of hydrogen in the oxide semiconductor layer 144 is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$, for example. Note that the concentration of hydrogen in the oxide semiconductor layer 144 is measured by secondary ion mass spectrometry (SIMS). Thus, in the oxide semiconductor layer 144 in which the hydrogen concentration is sufficiently reduced so that the oxide semiconductor layer is highly purified and defect states in the energy gap due to oxygen deficiency are reduced by sufficient supply of oxygen, the carrier concentration is lower than $1\times10^{12}$/cm$^3$, preferably lower than $1\times10^{11}$/cm$^3$, more preferably lower than $1.45\times10^{10}$/cm$^3$. For example, the off-state current (here, current per micrometer (μm) of channel width) at room temperature is 100 zA/μm or less, preferably 10 zA/μm or less (1 zA (zeptoampere) is $1\times10^{-21}$ A). With the use of such an i-type (intrinsic) or substantially i-type oxide semiconductor, the transistor 162 which has significantly excellent off-state current characteristics can be obtained.

Note that in the transistor 162 in FIGS. 7A and 7B, the oxide semiconductor layer 144 is not processed into an island shape; therefore, contamination of the oxide semiconductor layer 144 due to etching in the process can be prevented.

The capacitor 164 includes the source or drain electrode 142a, the oxide semiconductor layer 144, the gate insulating layer 146, and an electrode 148b. The source or drain electrode 142a serves as one electrode of the capacitor 164, and the electrode 148b serves as the other electrode of the capacitor 164.

Note that in the capacitor 164 in FIGS. 7A and 7B, the oxide semiconductor layer 144 and the gate insulating layer 146 are stacked, whereby insulation between the source or drain electrode 142a and the electrode 148b can be adequately secured.

Note that in the transistor 162 and the capacitor 164, end portions of the source or drain electrode 142a and the source or drain electrode 142b are preferably tapered. Here, the taper angle is 30° to 60° inclusive, for example. Note that the taper angle is a tilt angle formed between a side surface and a bottom surface of a layer having a tapered shape (e.g., the source or drain electrode 142a) when the layer is seen in a direction perpendicular to a cross-sectional plane (a plane perpendicular to the surface of a substrate). When the end portions of the source or drain electrode 142a and the source or drain electrode 142b are tapered, the coverage with the oxide semiconductor layer 144 can be improved and disconnection can be prevented.

Further, an interlayer insulating layer 150 is provided over the transistor 162 and the capacitor 164, and an interlayer insulating layer 152 is provided over the interlayer insulating layer 150.
<Method for Manufacturing Semiconductor Device>

Next, an example of a method for manufacturing the semiconductor device will be described. First, a method for manufacturing the transistor 160 in the lower portion will be described below with reference to FIGS. 8A to 8H, and then a method for manufacturing the transistor 162 in the upper portion will be described with reference to FIGS. 9A to 9E.
<Method for Manufacturing Transistor in Lower Portion>

Figure 8A:
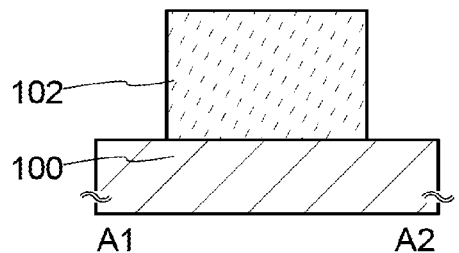
FIGS. 8A to 8H are cross-sectional views of a manufacturing process of a semiconductor device.

First, the substrate 100 including a semiconductor material is prepared (see FIG. 8A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example where a single crystal silicon substrate is used as the substrate 100 including a semiconductor material is described. Note that although the term "SOI substrate" generally means a substrate in which a silicon semiconductor layer is provided on an insulating surface, the term "SOI substrate" in this specification and the like also includes a substrate in which a semiconductor layer including a material other than silicon is provided on an insulating surface. That is, the semiconductor layer included in the "SOI substrate" is not limited to a silicon semiconductor layer. Moreover, the SOI substrate also includes a substrate having a structure in which a semiconductor layer is provided over an insulating substrate such as a glass substrate with an insulating layer interposed therebetween.

A protective layer 102 serving as a mask for forming an element isolation insulating layer is formed over the substrate 100 (see FIG. 8A). As the protective layer 102, an insulating layer formed using a material such as silicon oxide, silicon nitride, or silicon oxynitride can be used, for example. Note that before or after this step, an impurity element imparting n-type conductivity or p-type conductivity may be added to the substrate 100 in order to control the threshold voltage of the transistor. When the semiconductor in the substrate 100 is made of silicon, phosphorus (P), arsenic (As), or the like can be used as the impurity imparting n-type conductivity, and boron (B), aluminum (Al), gallium (Ga), or the like can be used as the impurity imparting p-type conductivity.

Then, part of the substrate 100 in a region that is not covered with the protective layer 102 (in an exposed region) is removed by etching using the protective layer 102 as a mask. Thus, a semiconductor region 104 isolated from the other semiconductor regions is formed (see FIG. 8B). As the etching, dry etching is preferably performed, but wet etching may be performed. An etching gas and an etchant can be selected as appropriate in accordance with a material to be etched.

Figure 8B:
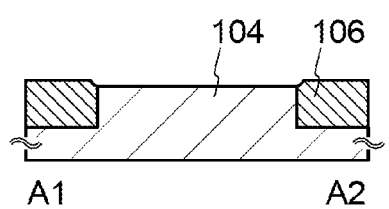

Then, an insulating layer is formed so as to cover the semiconductor region 104, and the insulating layer in a region overlapping with the semiconductor region 104 is selectively removed, whereby the element isolation insulating layer 106 is formed (see FIG. 8B). The insulating layer is formed using silicon oxide, silicon nitride, silicon oxynitride, or the like. For removing the insulating layer, any of etching treatment and polishing treatment such as CMP can be employed. Note that the protective layer 102 is removed after the formation of the semiconductor region 104 or after the formation of the element isolation insulating layer 106.

Then, an insulating layer is formed over the semiconductor region 104, and a layer including a conductive material is formed over the insulating layer.

The insulating layer serves as a gate insulating layer later, and the insulating layer may have a single-layer structure or stacked structure including a film which includes any of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, and the like, and is formed by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe, a gas such as oxygen, nitrogen oxide, ammonia, nitrogen, or hydrogen. The insulating layer can have a thickness of for example, 1 nm to 100 nm inclusive, preferably 10 nm to 50 nm inclusive.

The layer including a conductive material can be formed using a metal material such as aluminum, copper, titanium, tantalum, or tungsten. Further, the layer including a conductive material may be formed using a semiconductor material such as polycrystalline silicon. There is no particular limitation on the method for forming the layer including a conductive material, and a variety of film formation methods such as an evaporation method, a CVD method, a sputtering method, and a spin coating method can be employed. Note that in this embodiment, an example where the layer including a conductive material is formed using a metal material is described.

Figure 8C:
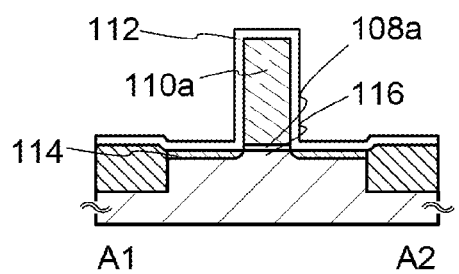

After that, the insulating layer and the layer including a conductive material are selectively etched, whereby the gate insulating layer 108a and the gate electrode 110a are formed (see FIG. 8C).

Then, an insulating layer 112 which covers the gate electrode 110a is formed (see FIG. 8C). Then, the impurity regions 114 with a shallow junction depth are formed by adding phosphorus (P), arsenic (As), or the like to the semiconductor region 104 (see FIG. 8C). Note that phosphorus (P) or arsenic (As) is added here in order to form an n-channel transistor; an impurity element such as boron (B) or aluminum (Al) may be added in order to form a p-channel transistor. The channel formation region 116 is formed in the semiconductor region 104 and below the gate insulating layer 108a by formation of the impurity regions 114 (see FIG. 8C). Here, the concentration of the impurity added can be set as appropriate; however, the concentration is preferably increased when the semiconductor element is highly miniaturized. The impurity regions 114 are formed after the formation of the insulating layer 112 here, but the insulating layer 112 may alternatively be formed after the formation of the impurity regions 114.

Figure 8D:
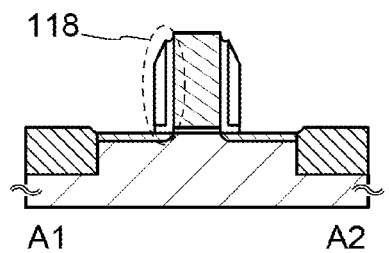
Figure 8E:
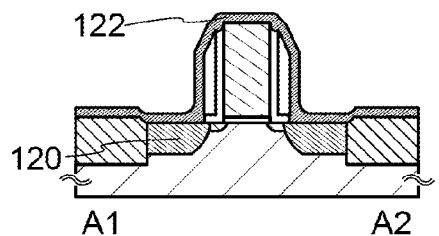
Figure 8F:
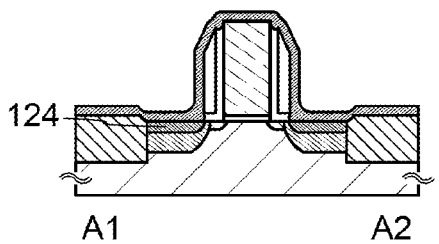

Then, the sidewall insulating layer 118 is formed (see FIG. 8D). An insulating layer is formed so as to cover the insulating layer 112 and then the insulating layer and the insulating layer 112 are subjected to highly anisotropic etching treatment, whereby the sidewall insulating layer 118 can be formed in a self-aligned manner. At this time, it is preferable to etch the insulating layer 112 partly so that a top surface of the gate electrode 110a and top surfaces of the impurity regions 114 are exposed. Note that the sidewall insulating layer 118 may be omitted in some cases for the purpose of high integration or the like.

Then, an insulating layer is formed so as to cover the gate electrode 110a, the impurity regions 114, the sidewall insulating layer 118, and the like. Then, phosphorus (P), arsenic (As), or the like is added to regions where the insulating layer is in contact with the impurity regions 114, whereby the high-concentration impurity regions 120 are formed (see FIG. 8E). After that, the insulating layer is removed. A metal layer 122 is formed so as to cover the gate electrode 110a, the sidewall insulating layer 118, the high-concentration impurity regions 120, and the like (see FIG. 8E). Any of a variety of film formation methods such as a vacuum evaporation method, a sputtering method, and a spin coating method can be employed for forming the metal layer 122. It is preferable that the metal layer 122 be formed using a metal material that reacts with a semiconductor material included in the semiconductor regions 104 to form a low-resistance metal compound. Examples of such a metal material include titanium, tantalum, tungsten, nickel, cobalt, and platinum.

Next, heat treatment is performed so that the metal layer 122 may react with the semiconductor material. Thus, the metal compound regions 124 that are in contact with the high-concentration impurity regions 120 are formed (see FIG. 8F). Note that when the gate electrode 110a is formed using polycrystalline silicon or the like, a metal compound region is also formed in a region of the gate electrode 110a in contact with the metal layer 122.

As the heat treatment, irradiation with a flash lamp can be employed, for example. Although it should be appreciated that another heat treatment method may be used, a method by which the heat treatment can be achieved in an extremely short time is preferably used in order to improve the controllability of chemical reaction for formation of the metal compound. Note that the metal compound regions 124 are formed by the reaction of the metal material and the semiconductor material and have sufficiently high conductivity. The formation of the metal compound regions can sufficiently reduce electric resistance and improve element characteristics. Note that the metal layer 122 is removed after the metal compound regions 124 are formed.

Figure 8G:
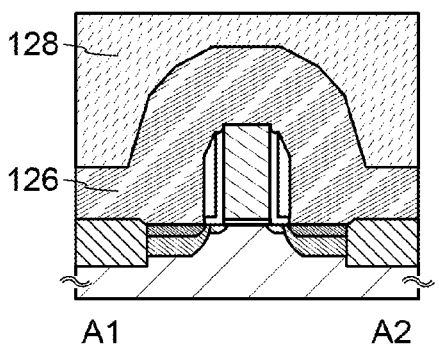

Then, the interlayer insulating layer 126 and the interlayer insulating layer 128 are formed so as to cover the components formed in the above steps (see FIG. 8G). The interlayer insulating layer 126 and the interlayer insulating layer 128 can be formed using a material including an inorganic insulating material such as silicon oxide, silicon oxynitride, silicon nitride, hafnium oxide, aluminum oxide, or tantalum oxide. Further, the interlayer insulating layer 126 and the interlayer insulating layer 128 can be formed using an organic insulating material such as polyimide or acrylic. Note that although a stacked structure of the interlayer insulating layer 126 and the interlayer insulating layer 128 is employed here, one embodiment of the disclosed invention is not limited to this. A single-layer structure or a stacked structure including three or more layers can be used. After the formation of the interlayer insulating layer 128, a surface thereof is preferably planarized by CMP, etching treatment, or the like.

Figure 8H:
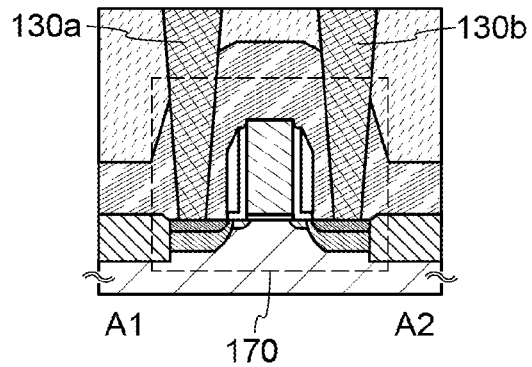

Then, openings that reach the metal compound regions 124 are formed in the interlayer insulating layers, and the source or drain electrode 130a and the source or drain electrode 130b are formed in the openings (see FIG. 8H). The source or drain electrode 130a and the source or drain electrode 130b can be formed in such a manner, for example, that a conductive layer is formed in a region including the openings by a PVD method, a CVD method, or the like and then part of the conductive layer is removed by etching treatment, CMP, or the like.

Specifically, it is possible to employ a method in which, for example, a thin titanium film is formed by a PVD method in a region including the openings, a thin titanium nitride film is formed by a CVD method, and then a tungsten film is formed so as to fill the openings. Here, the titanium film formed by a PVD method has a function of reducing an oxide film (such as a native oxide film) over which the titanium film is to be formed, and thereby lowering contact resistance with lower electrodes or the like (the metal compound regions 124, here). The titanium nitride film formed after the formation of the titanium film has a barrier function of preventing diffusion of the conductive material. A copper film may be formed by a plating method after the formation of the barrier film of titanium, titanium nitride, or the like.

Note that in the case where the source or drain electrode 130a and the source or drain electrode 130b are formed by removing part of the conductive layer, the process is preferably performed so that the surfaces may be planarized. For example, when a thin titanium film or thin titanium nitride film is formed in a region including the openings and then a tungsten film is formed so as to fill the openings, an unnecessary portion of the tungsten film, titanium film, titanium nitride film, or the like can be removed and the planarity of the surface can be improved by subsequent CMP. The surface including the surfaces of the source or drain electrode 130a and the source or drain electrode 130b is planarized in such a manner, whereby an electrode, a wiring, an insulating layer, a semiconductor layer, and the like can be favorably formed in later steps.

Note that only the source or drain electrode 130a and the source or drain electrode 130b in contact with the metal compound regions 124 are shown here; however, an electrode that is in contact with the gate electrode 110a and the like can also be formed in this step. There is no particular limitation on a material used for the source or drain electrode 130a and the source or drain electrode 130b, and any of a variety of conductive materials can be used. For example, a conductive material such as molybdenum, titanium, chromium, tantalum, tungsten, aluminum, copper, neodymium, or scandium can be used. In consideration of heat treatment performed later, it is preferable that the source or drain electrode 130a and the source or drain electrode 130b be formed using a material with heat resistance enough to withstand the heat treatment.

Through the above steps, the transistor 160 using the substrate 100 including a semiconductor material is formed (see FIG. 8H). The transistor 160 including a semiconductor material which is not an oxide semiconductor can operate at high speed.

Note that an electrode, a wiring, an insulating layer, or the like may be further formed after the above steps. When the wiring has a multi-layer structure including a stacked structure of an interlayer insulating layer and a conductive layer, a highly integrated semiconductor device can be provided.

<Method for Manufacturing Transistor in Upper Portion>

Next, steps of manufacturing the transistor 162 over the interlayer insulating layer 128 will be described with reference to FIGS. 9A to 9E. Note that FIGS. 9A to 9E illustrate steps of manufacturing electrodes, the transistor 162, and the like over the interlayer insulating layer 128; the transistor 160 and the like below the transistor 162 are omitted.

Figure 9A:
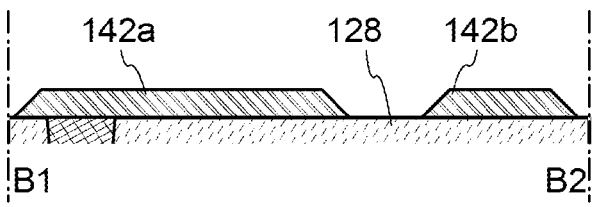
FIGS. 9A to 9E are cross-sectional views of a manufacturing process of a semiconductor device.

First, a conductive layer is formed over the interlayer insulating layer 128 and is selectively etched, whereby the source or drain electrode 142a and the source or drain electrode 142b are formed (see FIG. 9A).

The conductive layer can be formed by a PVD method typified by a sputtering method or a CVD method such as a plasma CVD method. As a material for the conductive layer, an element selected from aluminum, chromium, copper, tantalum, titanium, molybdenum, and tungsten; an alloy including any of these elements as a component; or the like can be used. Any of manganese, magnesium, zirconium, and beryllium, or a material including any of these in combination may be used. Further, aluminum combined with an element selected from titanium, tantalum, tungsten, molybdenum, chromium, neodymium, and scandium, or a material including any of these in combination may be used.

The conductive layer may have a single-layer structure or a stacked structure including two or more layers. For example, a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked, and the like can be given. Note that in the case where the conductive layer has a single-layer structure of a titanium film or a titanium nitride film, there is an advantage that the conductive layer is easily processed into the source or drain electrode 142a and the source or drain electrode 142b having tapered shapes.

Alternatively, the conductive layer may be formed using a conductive metal oxide. The conductive metal oxide can be indium oxide ($In_2O_3$), tin oxide ($SnO_2$), zinc oxide (ZnO), an indium oxide-tin oxide alloy ($In_2O_3$—$SnO_2$, which may be abbreviated to ITO), an indium oxide-zinc oxide alloy ($In_2O_3$—ZnO), or any of these metal oxide materials including silicon or silicon oxide.

The conductive layer is preferably etched so that end portions of the source or drain electrode 142a and the source or drain electrode 142b may be tapered. Here, the taper angle is preferably 30° to 60° inclusive, for example. When the source or drain electrode 142a and the source or drain electrode 142b are etched to have tapered end portions, the coverage with the gate insulating layer 146 formed later can be improved and breaking thereof due to a step can be prevented.

The channel length (L) of the transistor is determined by the distance between a lower end portion of the source or drain electrode 142a and a lower end portion of the source or drain electrode 142b. Note that in light exposure for forming a mask for a transistor with a channel length (L) of less than 25 nm, it is preferable to use extreme ultraviolet rays whose wavelength is as short as several nanometers to several tens of nanometers. The resolution of light exposure with extreme ultraviolet rays is high and the depth of focus is large. Accordingly, the channel length (L) of the transistor formed later can be 10 nm to 1000 nm (1 μm) inclusive, whereby an operation speed of a circuit can be increased. Moreover, power consumption of the semiconductor device can be reduced by miniaturization.

Note that an insulating layer serving as a base may be provided over the interlayer insulating layer 128. The insulating layer can be formed by a PVD method, a CVD method, or the like.

Further, an insulating layer may be formed over the source or drain electrode 142a and the source or drain electrode 142b. By providing the insulating layer, parasitic capacitance formed between a gate electrode formed later and the source and drain electrodes 142a and 142b can be reduced.

Figure 9B:
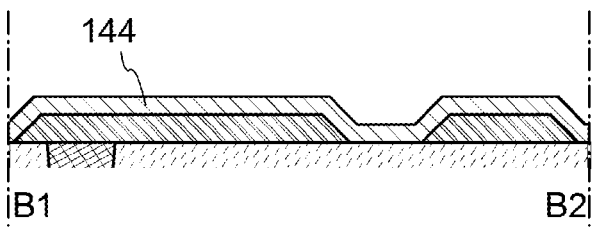

Then, the oxide semiconductor layer 144 is formed so as to cover the source or drain electrode 142a and the source or drain electrode 142b (see FIG. 9B).

The oxide semiconductor layer 144 can be formed using an In—Sn—Ga—Zn—O-based oxide semiconductor which is four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxide; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxide; an In—O-based oxide semiconductor, a Sn—O-based oxide semiconductor, a Zn—O-based oxide semiconductor which are one-component metal oxide; or the like.

In particular, an In—Ga—Zn—O-based oxide semiconductor material has sufficiently high resistance without an electric field and thus the off-state current can be sufficiently reduced. In addition, the In—Ga—Zn—O-based oxide semiconductor material has high field-effect mobility compared to a general silicon semiconductor and thus is suitable as a semiconductor material used for a semiconductor device.

As a typical example of the In—Ga—Zn—O-based oxide semiconductor material, the one represented by $InGaO_3(ZnO)_m$ (m>0) is given. In addition, an oxide semiconductor material in which Ga is replaced by M and is represented by $InMO_3(ZnO)_m$ (m>0) can also be given. Here, M denotes one or more metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like. Note that the above compositions are merely examples given in accordance with a crystal structure.

As a target used for forming the oxide semiconductor layer 144 by a sputtering method, a target having a composition ratio expressed by the equation In:Ga:Zn=1:x:y (x is 0 or more, and y is 0.5 to 5 inclusive) is preferable. For example, a target having a composition ratio expressed by the equation In:Ga:Zn=1:1:1 [atomic ratio] (x=1, y=1) (that is, $In_2O_3$:$Ga_2O_3$:ZnO=1:1:2 [molar ratio]), or the like can be used. Alternatively, a target having a composition ratio expressed by the equation In:Ga:Zn=1:1:0.5 [atomic ratio] (x=1, Y=0.5) (that is, $In_2O_3$:$Ga_2O_3$:ZnO=1:1:1 [molar ratio]), a target having a composition ratio expressed by the equation In:Ga:Zn=1:1:2 [atomic ratio] (x=1, y=2) (that is, $In_2O_3$:$Ga_2O_3$:ZnO=1:1:4 [molar ratio]), or a target having a composition ratio expressed by the equation In:Ga:Zn=1:0:1 [atomic ratio] (x=0, y=1) (that is, $In_2O_3$:ZnO=1:2 [molar ratio]) can be used.

In this embodiment, the oxide semiconductor layer 144 having an amorphous structure is formed by a sputtering method using an In—Ga—Zn—O-based metal oxide target.

The relative density of the metal oxide in the metal oxide target is 80% or higher, preferably 95% or higher, more preferably 99.9% or higher. With the use of the metal oxide target with high relative density, the oxide semiconductor layer 144 can be formed to have a dense structure.

The atmosphere in which the oxide semiconductor layer 144 is formed is preferably a rare gas (typically argon) atmosphere, an oxygen atmosphere, or a mixed atmosphere including a rare gas (typically argon) and oxygen. Specifically, it is preferable to use, for example, an atmosphere of a high-purity gas from which impurities such as hydrogen, water, hydroxyl, or hydride is removed so that the concentration thereof is reduced to 1 ppm or less (preferably the concentration is 10 ppb or less).

In the formation of the oxide semiconductor layer 144, for example, an object to be processed is held in a process chamber that is kept under reduced pressure and the object is heated so that the temperature of the object is higher than or equal to 100° C. and lower than 550° C., preferably 200° C. to 400° C. inclusive. Alternatively, the temperature of the object in the formation of the oxide semiconductor layer 144 may be room temperature. Moisture in the process chamber is removed, a sputtering gas from which hydrogen, water, and the like are removed is introduced, and the above target is used, so that the oxide semiconductor layer 144 is formed. By forming the oxide semiconductor layer 144 while heating the object, impurities in the oxide semiconductor layer 144 can be reduced. Further, damage by sputtering can be reduced. In order to remove moisture in the process chamber, an entrapment vacuum pump is preferably used. For example, a cryopump, an ion pump, a titanium sublimation pump, or the like can be used. Further, a turbo pump provided with a cold trap may be used. By evacuation with the cryopump or the like, hydrogen, water, and the like can be removed from the process chamber, whereby the impurity concentration of the oxide semiconductor layer 144 can be reduced.

The oxide semiconductor layer 144 can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferable because dust (such as powder substances formed at the time of film formation) can be reduced and the film thickness can be uniform. The thickness of the oxide semiconductor layer 144 is 1 nm to 50 nm inclusive, preferably 1 nm to 30 nm inclusive, more preferably 1 nm to 10 nm inclusive. With the oxide semiconductor layer 144 having such a thickness, a short-channel effect which occurs along with miniaturization can be suppressed. Note that the appropriate thickness differs depending on the oxide semiconductor material to be used, the intended use of the semiconductor device, or the like; therefore, the thickness can also be determined in accordance with the material, the intended use, or the like.

Note that before the oxide semiconductor layer 144 is formed by a sputtering method, a substance attached to a surface where the oxide semiconductor layer 144 is to be formed (e.g., a surface of the interlayer insulating layer 128) is preferably removed by reverse sputtering in which an argon gas is introduced to generate plasma. Here, the reverse sputtering refers to a method in which ions collide with a surface to be processed in order to modify the surface may, in contrast to normal sputtering in which ions collide with a sputtering target. As a method for making ions collide with a surface to be processed, a method is given for example where high-frequency voltage is applied to the surface to be processed in an argon atmosphere and plasma is generated in the vicinity of the object to be processed. Note that the atmosphere may be nitrogen, helium, oxygen, or the like instead of an argon atmosphere.

After that, heat treatment (first heat treatment) is preferably performed on the oxide semiconductor layer 144. By the first heat treatment, excessive hydrogen (including water and hydroxyl) in the oxide semiconductor layer 144 can be removed, the structure of the oxide semiconductor layer can be improved, and defect states in the energy gap can be reduced. The temperature of the first heat treatment is, for example, higher than or equal to 300° C. and lower than 550° C., or 400° C. to 500° C. inclusive.

The heat treatment can be performed in such a manner that, for example, the object to be processed is introduced into an electric furnace in which a resistance heating element or the like is used and heated at 450° C. for one hour in a nitrogen atmosphere. During the heat treatment, the oxide semiconductor layer 144 is not exposed to air to prevent entry of water and hydrogen.

The heat treatment apparatus is not limited to the electric furnace and may be an apparatus for heating an object by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas that does not react with the object by heat treatment, for example, nitrogen or a rare gas such as argon is used.

For example, as the first heat treatment, GRTA treatment may be performed in which the object is put in a heated inert gas atmosphere and heated for several minutes, and then taken out of the inert gas atmosphere. GRTA treatment enables high-temperature heat treatment for a short time. Moreover, GRTA treatment enables treatment at a temperature which exceeds the upper temperature limit. Note that the inert gas may be changed to a gas including oxygen in the treatment. This is because defect states in the energy gap due to oxygen vacancies can be reduced by performing the first heat treatment in an atmosphere including oxygen.

Note that as the inert gas atmosphere, an atmosphere that includes nitrogen or a rare gas (such as helium, neon, or argon) as a main component and does not include water, hydrogen, or the like is preferably used. For example, the purity of nitrogen or a rare gas such as helium, neon, or argon introduced into a heat treatment apparatus is higher than or equal to 6N (99.9999%), preferably higher than or equal to 7N (99.99999%) (that is, the concentration of an impurity is lower than or equal to 1 ppm, preferably lower than or equal to 0.1 ppm).

In any case, impurities are reduced by the first heat treatment so that the i-type (intrinsic) or substantially i-type oxide semiconductor layer 144 is obtained. Accordingly, a transistor having significantly excellent characteristics can be realized.

The above heat treatment (first heat treatment) has an effect of removing hydrogen, water, and the like and thus can be referred to as dehydration treatment, dehydrogenation treatment, or the like. The dehydration treatment or the dehydrogenation treatment can also be performed at the following timing: after the formation of the oxide semiconductor layer, after the formation of the gate insulating layer, after the formation of the gate electrode, or the like. Such dehydration treatment or dehydrogenation treatment may be performed once or more times.

Figure 9C:
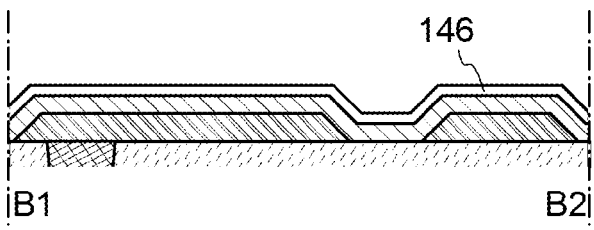

Next, the gate insulating layer 146 is formed in contact with the oxide semiconductor layer 144 (see FIG. 9C). The gate insulating layer 146 can be formed by a CVD method, a sputtering method, or the like. The gate insulating layer 146 is preferably includes silicon oxide, silicon nitride, silicon oxynitride, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a stacked structure. There is no particular limitation on the thickness of the gate insulating layer 146; in the case where the semiconductor device is miniaturized, the gate insulating layer 146 is preferably thin in order to secure the operation of the transistor. For example, in the case of using silicon oxide, the thickness can be 1 nm to 100 nm inclusive, preferably 10 nm to and 50 nm inclusive.

When the gate insulating layer is thin as in the above description, a problem of gate leakage due to a tunneling effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. With the use of a material with a high dielectric constant (high-k) material for the gate insulating layer 146, the thickness of the gate insulating layer 146 can be increased to prevent gate leakage and at the same time electrical characteristics can be maintained. Note that a stacked structure of a film including a high dielectric constant (high-k) material and a film including any of silicon oxide, silicon nitride, silicon oxynitride, silicon nitride oxide, aluminum oxide, and the like may be employed.

After the gate insulating layer 146 is formed, second heat treatment is preferably performed in an inert gas atmosphere or an oxygen atmosphere. The temperature of the heat treatment is 200° C. to 450° C. inclusive, preferably 250° C. to 350° C. inclusive. For example, the heat treatment may be performed at 250° C. for one hour in a nitrogen atmosphere. The second heat treatment can reduce variation in electric characteristics of the transistors. Moreover, in the case where the gate insulating layer 146 includes oxygen, oxygen can be supplied to the oxide semiconductor layer 144 to fill oxygen defects in the oxide semiconductor layer 144, whereby an i-type (intrinsic) or substantially i-type oxide semiconductor layer can be formed.

Note that the second heat treatment is performed after the gate insulating layer 146 is formed in this embodiment; however, the timing of the second heat treatment is not particularly limited to this. For example, the second heat treatment may be performed after the gate electrode is formed. Alternatively, the first heat treatment and the second heat treatment may be successively performed, the first heat treatment may double as the second heat treatment, or the second heat treatment may double as the first heat treatment.

Figure 9D:
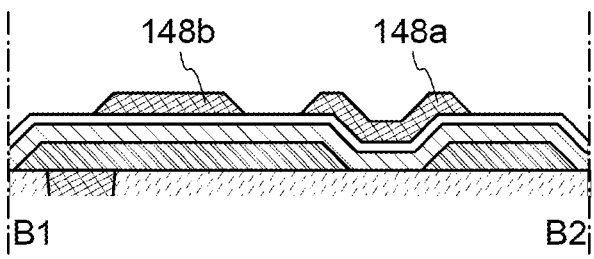

Then, over the gate insulating layer 146, the gate electrode 148a is formed in a region overlapping with the oxide semiconductor layer 144 and the electrode 148b is formed in a region overlapping with the source or drain electrode 142a (see FIG. 9D).

The gate electrode 148a and the electrode 148b can be formed by forming a conductive layer over the gate insulating layer 146 and then selectively etching the conductive layer. The conductive layer to be processed into the gate electrode 148a and the electrode 148b can be formed by a PVD method typified by a sputtering method or a CVD method such as a plasma CVD method. The details are similar to those of the source or drain electrode 142a or the like; thus, description thereof can be referred to.

Figure 9E:
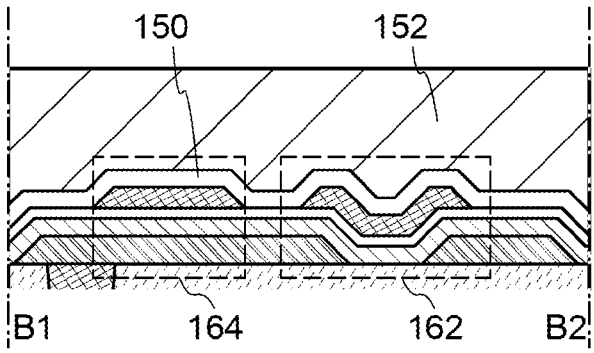

Then, the interlayer insulating layer 150 and the interlayer insulating layer 152 are formed over the gate insulating layer 146, the gate electrode 148a, and the electrode 148b (see FIG. 9E). The interlayer insulating layer 150 and the interlayer insulating layer 152 can be formed by a PVD method, a CVD method, or the like. The interlayer insulating layer 150 and the interlayer insulating layer 152 can be formed using a material including an inorganic insulating material such as silicon oxide, silicon oxynitride, silicon nitride, hafnium oxide, aluminum oxide, or tantalum oxide. Note that although a stacked structure of the interlayer insulating layer 150 and the interlayer insulating layer 152 is employed in this embodiment, one embodiment of the disclosed invention is not limited to this. A single-layer structure or a stacked structure including three or more layers can be used. Alternatively, the interlayer insulating layer may be omitted.

Note that the interlayer insulating layer 152 is preferably formed so as to have a planarized surface. By forming the interlayer insulating layer 152 having a planarized surface, an electrode, a wiring, or the like can be favorably formed over the interlayer insulating layer 152 even in the case where the semiconductor device is miniaturized, for example. The interlayer insulating layer 152 can be planarized by a method such as chemical mechanical polishing (CMP).

Through the above steps, the transistor 162 including the highly purified oxide semiconductor layer 144 is completed (see FIG. 9E). In addition, the capacitor 164 is also completed.

The transistor 162 illustrated in FIG. 9E includes the oxide semiconductor layer 144; the source or drain electrode 142a and the source or drain electrode 142b which are electrically connected to the oxide semiconductor layer 144; the gate insulating layer 146 which covers the oxide semiconductor layer 144, the source or drain electrode 142a, and the source or drain electrode 142b; and the gate electrode 148a over the gate insulating layer 146. Further, the capacitor 164 includes the source or drain electrode 142a, the oxide semiconductor layer 144, the gate insulating layer 146 which covers the oxide semiconductor 114, the source or drain electrode 142a, and the electrode 148b over the gate insulating layer 146.

In the transistor 162 described in this embodiment, the oxide semiconductor layer 144 is highly purified and thus the hydrogen concentration thereof is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. The carrier density of the oxide semiconductor layer 144 is sufficiently low (e.g., lower than $1 \times 10^{12}$/cm$^3$, preferably lower than $1.45 \times 10^{10}$/cm$^3$) as compared to the carrier density of a general silicon wafer (approximately $1 \times 10^{14}$/cm$^3$). Accordingly, the off-state current of the transistor 162 is sufficiently small. For example, the off-state current (here, current per micrometer (μm) of channel width) at room temperature is 100 zA/μm or less, preferably 10 zA/mm or less (1 zA (zeptoampere) is $1 \times 10^{-21}$ A).

With the use of the highly purified intrinsic oxide semiconductor layer 144, the off-state current of the transistor can be sufficiently reduced. Further, with the use of such a transistor, a semiconductor device capable of holding stored data for an extremely long time can be obtained.

The structures, methods, and the like described in this embodiment can be combined as appropriate with any of the structures and methods described in the other embodiments.

Embodiment 4

In this embodiment, a structure and manufacturing method of a semiconductor device according to an embodiment of the disclosed invention, which are different from those of Embodiment 3, will be described with reference to FIGS. 10A and 10B and FIGS. 11A to 11D.

<Cross-Sectional Structure and Planar Structure of Semiconductor Device>

Figure 10A:
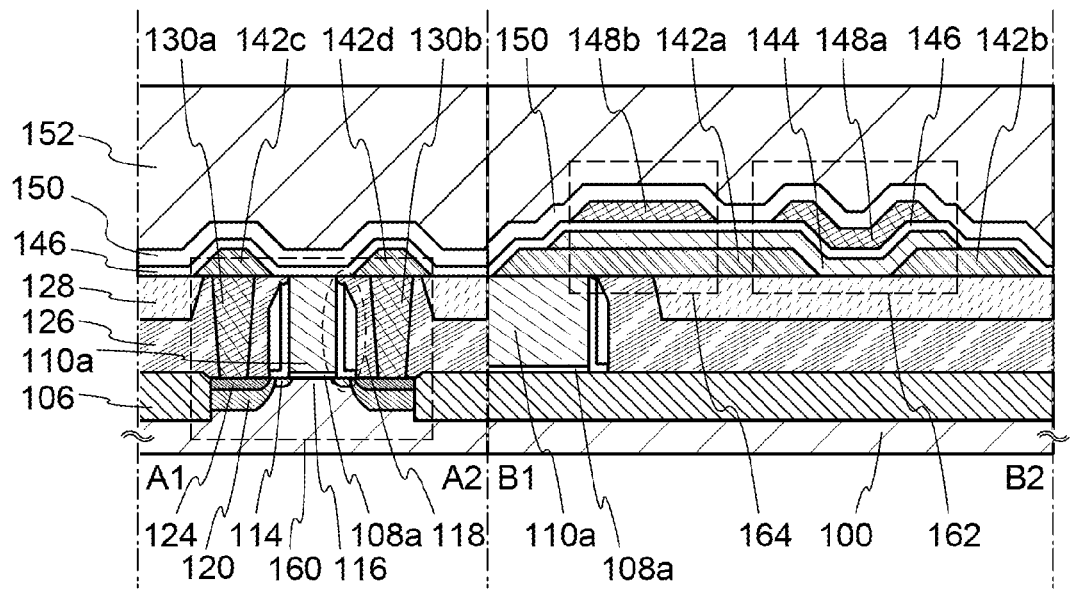
FIGS. 10A and 10B are a cross-sectional view and a plan view of a semiconductor device.
Figure 10B:
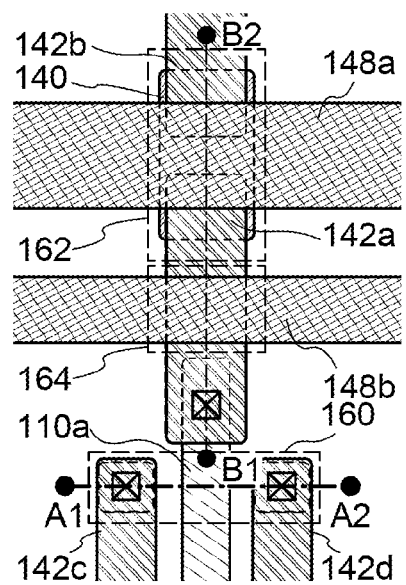

FIGS. 10A and 10B illustrate an example of a structure of a semiconductor device. FIG. 10A illustrates a cross section of the semiconductor device, and FIG. 10B illustrates a plan view of the semiconductor device. Here, FIG. 10A illustrates a cross section taken along line A1-A2 and line B1-B2 in FIG. 10B. The semiconductor device illustrated in FIGS. 10A and 10B includes the transistor 160 including a semiconductor material which is not an oxide semiconductor in a lower portion, and the transistor 162 including an oxide semiconductor in an upper portion. The transistor 160 including a semiconductor material which is not an oxide semiconductor can operate at high speed easily. On the other hand, the transistor 162 including an oxide semiconductor can hold charge for a long time because of its characteristics.

Although both of the transistors are n-channel transistors in this description, it should be appreciated that p-channel transistors can be used. Since the technical feature of the disclosed invention lies in the use of an oxide semiconductor in the transistor 162 in order to hold data, it is not necessary to limit a specific structure of the semiconductor device to the structure described here.

The transistor 160 in FIGS. 10A and 10B includes the channel formation region 116 provided in the substrate 100 including a semiconductor material (e.g., silicon), the impurity regions 114 and the high-concentration impurity regions 120 (these regions are also collectively referred to simply as impurity regions) provided so that the channel formation region 116 is sandwiched therebetween, the gate insulating layer 108a provided over the channel formation region 116, the gate electrode 110a provided over the gate insulating layer 108a, and the source or drain electrode 130a and the source or drain electrode 130b electrically connected to the impurity regions. A wiring 142c and a wiring 142d are provided over the source or drain electrode 130a and the source or drain electrode 130b, respectively.

The sidewall insulating layer 118 is provided on a side surface of the gate electrode 110a. The high-concentration impurity region 120 is positioned in a region of the substrate 100 which does not overlap with the sidewall insulating layer 118 when seen in a direction perpendicular to the surface of the substrate 100. The metal compound region 124 is provided in contact with the high-concentration impurity region 120. The substrate 100 is provided with the element isolation insulating layer 106 which surrounds the transistor 160. The interlayer insulating layer 126 and the interlayer insulating layer 128 having an opening over the gate electrode 110a are provided so as to cover the transistor 160. Each of the source or drain electrode 130a and the source or drain electrode 130b is electrically connected to the metal compound region 124 through an opening formed in the interlayer insulating layer 126 and the interlayer insulating layer 128. Thus, each of the source or drain electrodes 130a and 130b is electrically connected to the high-concentration impurity region 120 and the impurity region 114 through the metal compound region 124. Note that the sidewall insulating layer 118 may be omitted in some cases for integration of the transistor 160 or the like.

The transistor 162 in FIGS. 10A and 10B includes the source or drain electrode 142a and the source or drain electrode 142b which are provided over the interlayer insulating layer 128; the island-shaped oxide semiconductor layer 144 which is electrically connected to the source or drain electrode 142a and the source or drain electrode 142b; a gate insulating layer 146 which covers the source or drain electrode 142a, the source or drain electrode 142b, and the island-shaped oxide semiconductor layer 144; and a gate electrode 148a which is provided over the gate insulating layer 146 so as to overlap with the island-shaped oxide semiconductor layer 144.

Here, the source or drain electrode 142a is formed directly on the gate electrode 110a, whereby the transistor 160 in the lower portion and the transistor 162 in the upper portion are electrically connected to each other. That is, the semiconductor device described in this embodiment has a structure where, in the semiconductor device described in Embodiment 3, a portion above the top surface of the gate electrode 110a is removed and the transistor 162 in the upper portion is formed above the transistor 160 in the lower portion.

Note that, it is preferable that the oxide semiconductor layer 144 be purified by sufficient removal of impurities such as hydrogen and/or sufficient supply of oxygen. Specifically, the concentration of hydrogen in the oxide semiconductor layer 144 is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$, for example. Note that the concentration of hydrogen in the oxide semiconductor layer 144 is measured by secondary ion mass spectrometry (SIMS). Thus, in the oxide semiconductor layer 144 in which the hydrogen concentration is sufficiently reduced so that the oxide semiconductor layer is purified and defect states in the energy gap due to oxygen deficiency are reduced by sufficient supply of oxygen, the carrier concentration is lower than $1\times10^{12}$/cm$^3$, preferably lower than $1\times10^{11}$/cm$^3$, more preferably lower than $1.45\times10^{10}$/cm$^3$. For example, the off-state current (here, current per micrometer (μm) of channel width) at room temperature is 100 zA/μm or less, preferably 10 zA/μm or less (1 zA (zeptoampere) is $1\times10^{-21}$ A). With the use of such an i-type (intrinsic) or substantially i-type oxide semiconductor, the transistor 162 which has significantly excellent off-state current characteristics can be obtained.

The capacitor 164 includes the source or drain electrode 142a, the oxide semiconductor layer 144, the gate insulating layer 146, and an electrode 148b. The source or drain electrode 142a serves as one electrode of the capacitor 164, and the electrode 148b serves as the other electrode of the capacitor 164.

Note that in the capacitor 164 in FIGS. 10A and 10B, the oxide semiconductor layer 144 and the gate insulating layer 146 are stacked, whereby insulation between the source or drain electrode 142a and the electrode 148b can be adequately secured.

Note that in the transistor 162 and the capacitor 164, end portions of the source or drain electrode 142a and the source or drain electrode 142b are preferably tapered. Here, the taper angle is 30° to 60° inclusive, for example. Note that the taper angle is a tilt angle formed between a side surface and a bottom surface of a layer having a tapered shape (e.g., the source or drain electrode 142a) when the layer is seen in a direction perpendicular to a cross-sectional plane (a plane perpendicular to the surface of a substrate). When the end portions of the source or drain electrode 142a and the source or drain electrode 142b are tapered, the coverage with the oxide semiconductor layer 144 can be improved and disconnection can be prevented.

Further, an interlayer insulating layer 150 is provided over the transistor 162 and the capacitor 164, and an interlayer insulating layer 152 is provided over the interlayer insulating layer 150.

<Method for Manufacturing Semiconductor Device>

Next, an example of a method for manufacturing the semiconductor device will be described. Hereinafter, steps performed after the formation of the transistor 160 in the lower portion, and a method for manufacturing the transistor 162 in the upper portion will be described with reference to FIGS. 11A to 11D. The transistor 160 in the lower portion can be manufactured by a method similar to that described in Embodiment 3, and description in Embodiment 3 can be referred to.

Figure 11A:
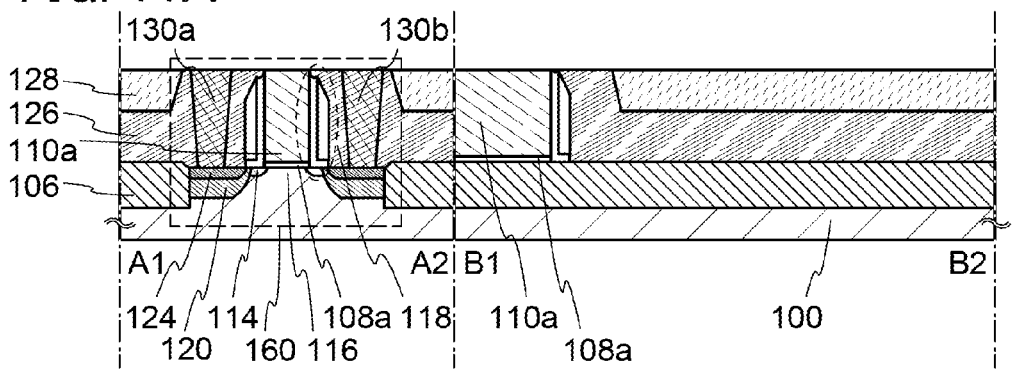
FIGS. 11A to 11D are cross-sectional views of a manufacturing process of a semiconductor device.

The transistor 160 in the lower portion is formed by the method described in Embodiment 3 first, and then a portion of the transistor 160 above the top surface of the gate electrode 110a is removed (see FIG. 11A). The portion of the transistor 160 over the top surface of the gate electrode 110a is removed by performing polishing treatment (CMP treatment) on the transistor 160 in the lower portion until the top surface of the gate electrode 110a is exposed. Thus, portions of the interlayer insulating layers 126 and 128 and the source and drain electrodes 130a and 130b above the gate electrode 110a are removed. At this time, the surface including surfaces of the interlayer insulating layers 126 and 128 and the source and drain electrodes 130a and 130b is planarized, whereby an electrode, a wiring, an insulating layer, a semiconductor layer, and the like can be favorably formed in later steps. In addition, the electrode 130c described in Embodiment 3 does not need to be formed because it would be completely removed by the CMP treatment.

The top surface of the gate electrode 110a is exposed by the CMP treatment in this manner, whereby the gate electrode 110a and the source or drain electrode 142a can be directly connected to each other; accordingly, the transistor 160 and the transistor 162 can be easily electrically connected to each other.

Figure 11B:
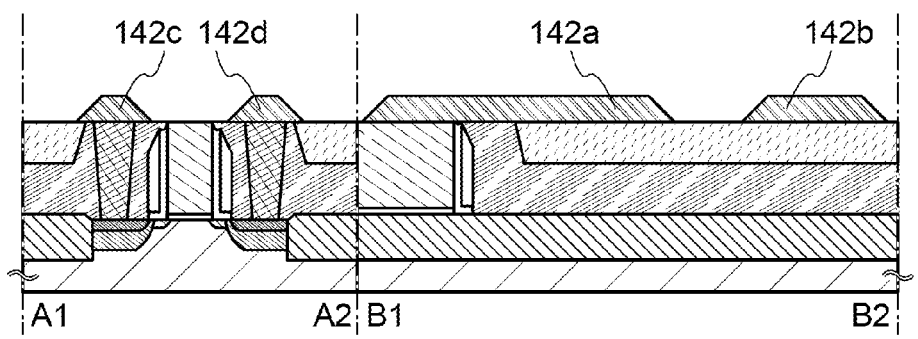

Then, a conductive layer is formed over the interlayer insulating layers 126 and 128 and etched selectively, whereby the source or drain electrode 142a, the source or drain electrode 142b, the wiring 142c, and the wiring 142d are formed (see FIG. 11B). Here, the source or drain electrode 142a, the wiring 142c, and the wiring 142d are formed so as to be directly connected to the gate electrode 110a, the source or drain electrode 130a, and the source or drain electrode 130b, respectively.

Here, for the conductive layer processed into the source or drain electrode 142a, the source or drain electrode 142b, the wiring 142c, and the wiring 142d, a material similar to that described in Embodiment 3 can be used and the description in Embodiment 3 can be referred to. Etching of the conductive layer can also be performed in a manner similar to the method described in Embodiment 3, and the description in Embodiment 3 can be referred to.

Further, as in the case of Embodiment 3, an insulating layer may be formed over the source or drain electrode 142a and the source or drain electrode 142b. By providing the insulating layer, parasitic capacitance formed between a gate electrode formed later and the source and drain electrodes 142a and 142b can be reduced.

Figure 11C:
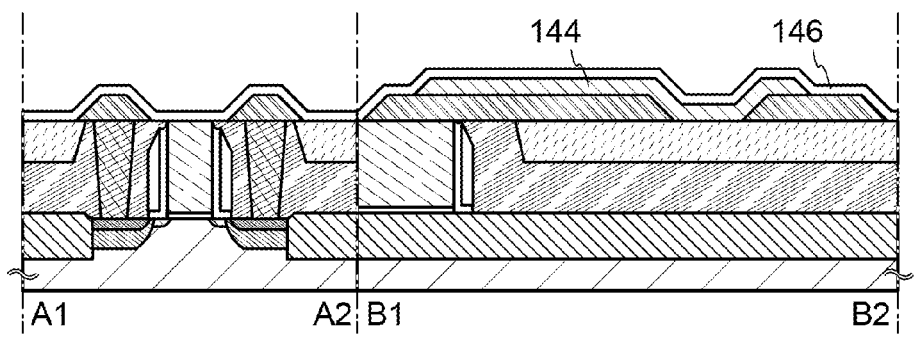

Next, an oxide semiconductor layer is formed so as to cover the source or drain electrode 142a, the source or drain electrode 142b, the wiring 142c, and the wiring 142d and the oxide semiconductor layer is selectively etched, whereby the oxide semiconductor layer 144 is formed in contact with the source or drain electrode 142a and the source or drain electrode 142b (see FIG. 11C).

The oxide semiconductor layer can be formed using a material and a method similar to those described in Embodiment 3. Therefore, Embodiment 3 can be referred to for a material and a formation method of the oxide semiconductor layer.

The oxide semiconductor layer formed in this manner is processed into an island shape by a method such as etching using a mask, whereby the island-shaped oxide semiconductor layer 144 is formed.

As the etching of the oxide semiconductor layer, either dry etching or wet etching may be employed. Needless to say, dry etching and wet etching can be used in combination. The etching conditions (such as an etching gas, an etchant, etching time, and temperature) are set as appropriate in accordance with the material so that the oxide semiconductor layer can be etched into a desired shape.

Further, the oxide semiconductor layer 144 is preferably subjected to heat treatment (the first heat treatment) as described in Embodiment 3. The first heat treatment can be performed by the method described in Embodiment 3, and Embodiment 3 can be referred to. Impurities are reduced by the first heat treatment so that the i-type (intrinsic) or substantially i-type oxide semiconductor layer 144 is obtained.

Accordingly, a transistor having significantly excellent characteristics can be realized. Note that the first heat treatment may be performed before the oxide semiconductor layer is etched or after the oxide semiconductor layer is etched into an island shape.

Then, the gate insulating layer 146 is formed in contact with the oxide semiconductor layer 144 (see FIG. 11C).

The gate insulating layer 146 can be formed using a material and a method similar to those described in Embodiment 3. Therefore, Embodiment 3 can be referred to for a material and a formation method of the gate insulating layer 146.

After the gate insulating layer 146 is formed, second heat treatment is preferably performed in an inert gas atmosphere or an oxygen atmosphere as described in Embodiment 3. The second heat treatment can be performed by the method described in Embodiment 3, and Embodiment 3 can be referred to. The second heat treatment can reduce variation in electric characteristics of the transistor. Moreover, in the case where the gate insulating layer 146 includes oxygen, oxygen can be supplied to the oxide semiconductor layer 144 to fill oxygen defects in the oxide semiconductor layer 144, whereby an i-type (intrinsic) or substantially i-type oxide semiconductor layer can be formed.

Note that the second heat treatment is performed after the gate insulating layer 146 is formed in this embodiment; however, the timing of the second heat treatment is not particularly limited to this. For example, the second heat treatment may be performed after the gate electrode is formed. Alternatively, the first heat treatment and the second heat treatment may be successively performed, the first heat treatment may double as the second heat treatment, or the second heat treatment may double as the first heat treatment.

Figure 11D:
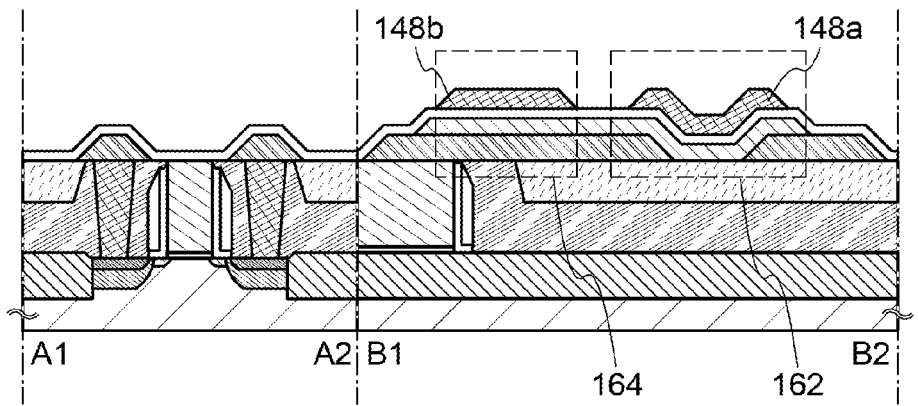

Then, over the gate insulating layer 146, the gate electrode 148a is formed in a region overlapping with the oxide semiconductor layer 144 and the electrode 148b is formed in a region overlapping with the source or drain electrode 142a (see FIG. 11D). The gate electrode 148a and the electrode 148b can be formed by forming a conductive layer over the gate insulating layer 146 and then selectively etching the conductive layer. The conductive layer to be processed into the gate electrode 148a and the electrode 148b can be formed by a PVD method typified by a sputtering method or a CVD method such as a plasma CVD method. The details are similar to those of the source or drain electrode 142a or the like; thus, description thereof can be referred to.

Then, as described in Embodiment 3, the interlayer insulating layer 150 and the interlayer insulating layer 152 are formed over the gate insulating layer 146, the gate electrode 148a, and the electrode 148b. The interlayer insulating layer 150 and the interlayer insulating layer 152 can be formed using materials and methods similar to those described in Embodiment 3. Therefore, Embodiment 3 can be referred to for materials and formation methods of the interlayer insulating layer 150 and the interlayer insulating layer 152.

Note that the interlayer insulating layer 152 is preferably formed so as to have a planarized surface. By forming the interlayer insulating layer 152 having a planarized surface, an electrode, a wiring, or the like can be favorably formed over the interlayer insulating layer 152 even in the case where the semiconductor device is miniaturized, for example. The interlayer insulating layer 152 can be planarized by a method such as chemical mechanical polishing (CMP).

Through the above steps, the transistor 162 including the purified oxide semiconductor layer 144 is completed (see FIGS. 10A and 10B). In addition, the capacitor 164 is also completed.

The transistor 162 illustrated in FIGS. 10A and 10B includes the oxide semiconductor layer 144; the source or drain electrode 142a and the source or drain electrode 142b which are electrically connected to the oxide semiconductor layer 144; the gate insulating layer 146 which covers the oxide semiconductor layer 144, the source or drain electrode 142a, and the source or drain electrode 142b; and the gate electrode 148a over the gate insulating layer 146. Further, the capacitor 164 includes the source or drain electrode 142a, the oxide semiconductor layer 144, the gate insulating layer 146 which covers the oxide semiconductor 114, the source or drain electrode 142a, and the electrode 148b over the gate insulating layer 146.

In the transistor 162 described in this embodiment, the oxide semiconductor layer 144 is purified and thus the hydrogen concentration thereof is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$. The carrier density of the oxide semiconductor layer 144 is sufficiently low (e.g., lower than $1\times10^{12}$/cm$^3$, preferably lower than $1.45\times10^{10}$/cm$^3$) as compared to the carrier density of a general silicon wafer (approximately $1\times10^{14}$/cm$^3$). Accordingly, the off-state current of the transistor 162 is sufficiently small. For example, the off-state current (here, current per micrometer (μm) of channel width) at room temperature is 100 zA/μm or less, preferably 10 zA/μm or less (1 zA (zeptoampere) is $1\times10^{-21}$ A).

With the use of the purified intrinsic oxide semiconductor layer 144, the off-state current of the transistor can be sufficiently reduced. Further, with the use of such a transistor, a semiconductor device capable of holding stored data for an extremely long time can be obtained.

The structures, methods, and the like described in this embodiment can be combined as appropriate with any of the structures and methods described in the other embodiments.

Embodiment 5

In this embodiment, a structure and manufacturing method of a semiconductor device according to an embodiment of the disclosed invention, which are different from those of Embodiments 3 and 4, will be described with reference to FIGS. 4A and 4B, FIGS. 5A to 5D, and FIGS. 6A to 6C.

<Cross-Sectional Structure and Planar Structure of Semiconductor Device>

Figure 4A:
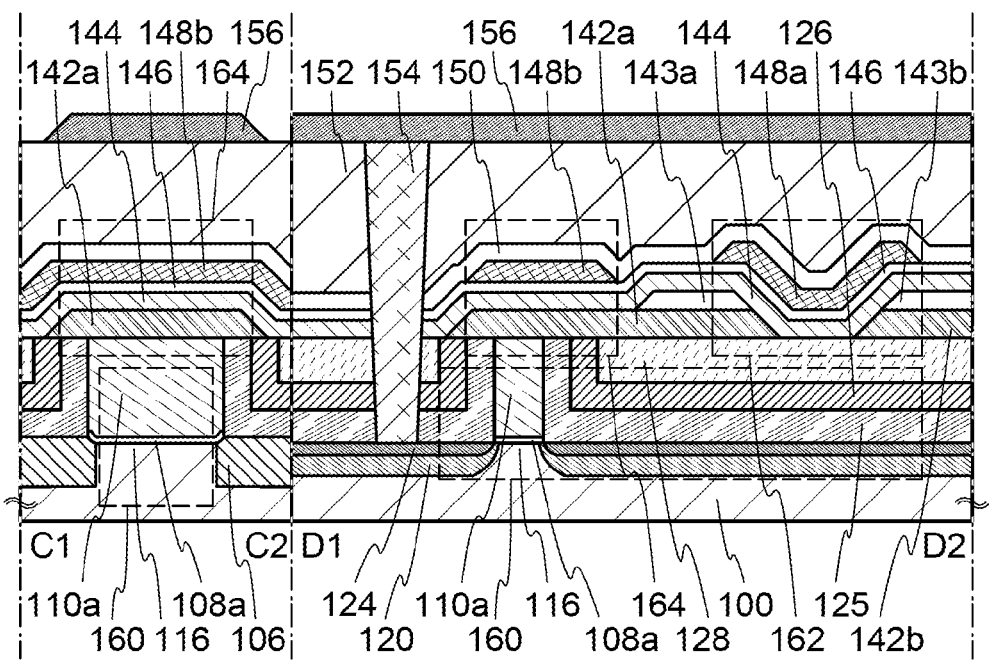
FIGS. 4A and 4B are a cross-sectional view and a plan view of a semiconductor device.
Figure 4B:
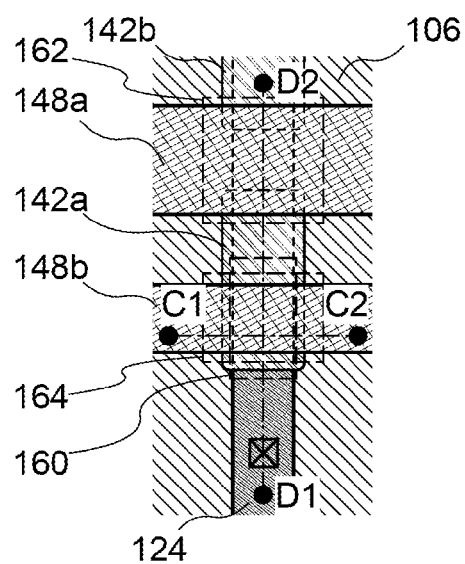

FIGS. 4A and 4B illustrate an example of a structure of a semiconductor device. FIG. 4A illustrates a cross section of the semiconductor device, and FIG. 4B illustrates a plan view of the semiconductor device. Here, FIG. 4A illustrates a cross section taken along line C1-C2 and line D1-D2 in FIG. 4B. In the plan view of FIG. 4B, some of components, such as a source or drain electrode 154 and a wiring 156, are omitted to avoid complexity. The semiconductor device illustrated in FIGS. 4A and 4B includes the transistor 160 including a semiconductor material which is not an oxide semiconductor in a lower portion, and the transistor 162 including an oxide semiconductor in an upper portion. The transistor 160 including a semiconductor material which is not an oxide semiconductor can operate at high speed easily. On the other hand, the transistor 162 including an oxide semiconductor can hold charge for a long time because of its characteristics.

Although both of the transistors are n-channel transistors in this description, it should be appreciated that p-channel transistors can be used. Since the technical feature of the disclosed invention lies in the use of an oxide semiconductor in the transistor 162 in order to hold data, it is not necessary to limit a specific structure of the semiconductor device to the structure described here.

The semiconductor device in FIGS. 4A and 4B is different from the semiconductor devices described in the above embodiments in a plane layout of the semiconductor device. In this embodiment, the transistor 162 and the capacitor 164 are provided so as to overlap with the transistor 160. By employing such a plane layout, high integration is possible. For example, given that the minimum processing dimension is F, the area occupied by a memory cell can be 15 $F^2$ to 25 $F^2$.

The semiconductor device in FIGS. 4A and 4B is different from the semiconductor devices described in the above embodiments in that the sidewall insulating layer 118 is not provided in the transistor 160. That is, the semiconductor device in FIGS. 4A and 4B does not include a sidewall insulating layer. Since the sidewall insulating layer is not formed, the impurity region 114 is not formed. In such a case where the sidewall insulating layer is not provided, high integration is easy as compared to the case where the sidewall insulating layer 118 is provided. In addition, the manufacturing process can be simplified as compared to the case where the sidewall insulating layer 118 is provided.

The semiconductor device in FIGS. 4A and 4B is different from the semiconductor devices described in the above embodiments also in that an interlayer insulating layer 125 is provided in the transistor 160. That is, the semiconductor device in FIGS. 4A and 4B includes the interlayer insulating layer 125. By using an insulating layer including hydrogen as the interlayer insulating layer 125, hydrogen can be supplied to the transistor 160 and the characteristics of the transistor 160 can be improved. As the interlayer insulating layer 125, for example, a silicon nitride layer including hydrogen, which is formed by a plasma CVD method, is given. Further, by using an insulating layer in which hydrogen is sufficiently reduced as the interlayer insulating layer 126, hydrogen which might adversely affect the characteristics of the transistor 162 can be prevented from being included in the transistor 162. As the interlayer insulating layer 126, for example, a silicon nitride layer formed by a sputtering method is given. When such a structure is employed, the characteristics of the transistor 160 and the transistor 162 can be improved sufficiently.

The semiconductor device in FIGS. 4A and 4B is different from the semiconductor devices described in the above embodiments also in that an insulating layer 143a and an insulating layer 143b are provided in the transistor 162. That is, the semiconductor device in FIGS. 4A and 4B includes the insulating layer 143a and the insulating layer 143b. By thus providing the insulating layer 143a and the insulating layer 143b, so-called gate capacitance formed by the gate electrode 148a and the source or drain electrode 142a (or the gate electrode 148a and the source or drain electrode 142b) can be reduced and the operation speed of the transistor 162 can be increased.

Note that as in Embodiment 4, the source or drain electrode 142a is formed directly on the gate electrode 110a, whereby the transistor 160 in the lower portion and the transistor 162 in the upper portion are electrically connected to each other. With such a structure, the semiconductor device can be highly integrated compared to the case where an electrode and a wiring are additionally provided. In addition, the manufacturing process can be simplified.

Although the structure in this embodiment includes all of the above differences, a structure including any one of the differences may be employed.

<Method for Manufacturing Semiconductor Device>

Next, an example of a method for manufacturing the semiconductor device will be described. Hereinafter, steps performed after the formation of the transistor 160 in the lower portion, and a method for manufacturing the transistor 162 in the upper portion will be described with reference to FIGS. 5A to 5D and FIG. 6A to 6C. The transistor 160 in the lower portion can be manufactured by a method similar to that described in Embodiment 3. Embodiment 3 can be referred to for the details. Note that the three interlayer insulating layers 125, 126, and 128 are formed so as to cover the transistor 160 in this embodiment (cf. FIG. 8G). Note that the source or drain electrode 130a and the source or drain electrode 130b are not formed through the manufacturing process of the transistor 160 in this embodiment (cf. FIG. 8H), but the structure without the source or drain electrode 130a and the source or drain electrode 130b is also called the transistor 160 for convenience.

The transistor 160 in the lower portion is formed by the method described in Embodiment 3 first, and then a portion of the transistor 160 above the top surface of the gate electrode 110a is removed. For the removing step, polishing treatment such as chemical mechanical polishing (CMP) may be used. Thus, portions of the interlayer insulating layer 125, the interlayer insulating layer 126, and the interlayer insulating layer 128 above the top surface of the gate electrode 110a are removed. Note that the surface subjected to the polishing treatment is planarized sufficiently, whereby an electrode, a wiring, an insulating layer, a semiconductor layer, and the like can be favorably formed in later steps.

Figure 5A:
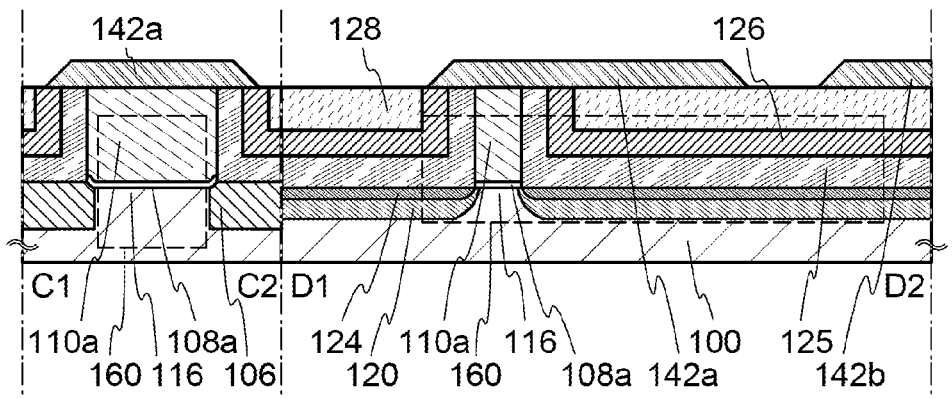
FIGS. 5A to 5D are cross-sectional views of a manufacturing process of a semiconductor device.

Then, a conductive layer is formed over the gate electrode 110a, the interlayer insulating layer 125, the interlayer insulating layer 126, and the interlayer insulating layer 128, and is etched selectively, whereby the source or drain electrode 142a and the source or drain electrode 142b are formed (see FIG. 5A). Here, the source or drain electrode 142a is formed so as to be directly connected to the gate electrode 110a.

The conductive layer used for forming the source or drain electrode 142a and the source or drain electrode 142b can be formed using materials similar to those described in Embodiment 3. Further, the conductive layer can be etched by a method similar to that described in Embodiment 3. Embodiment 3 can be referred to for the details.

Figure 5B:
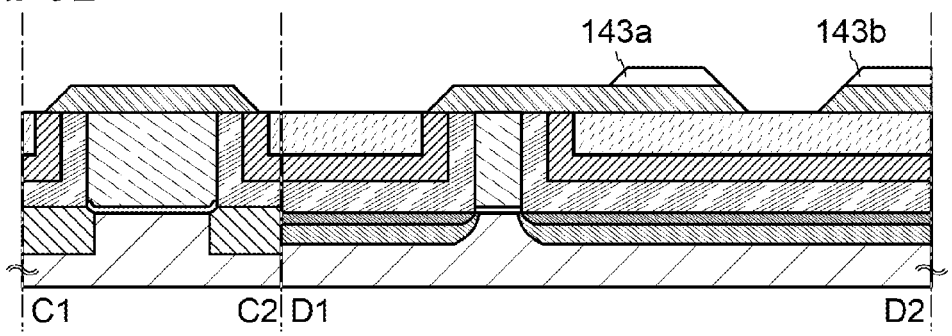

Next, an insulating layer is formed so as to cover the source or drain electrode 142a and the source or drain electrode 142b and etched selectively, whereby the insulating layer 143a and the insulating layer 143b are formed over the source or drain electrode 142a and the source or drain electrode 142b, respectively (see FIG. 5B).

By providing the insulating layer 143a and the insulating layer 143b, parasitic capacitance formed between a gate electrode formed later and the source or drain electrode 142a and between the gate electrode formed later and the source or drain electrode 142b can be reduced.

Figure 5C:
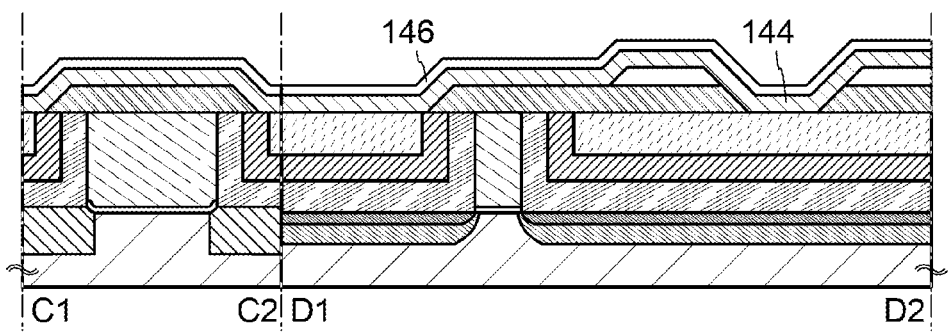

Then, the oxide semiconductor layer 144 is formed so as to cover the source or drain electrode 142a and the source or drain electrode 142b, and the gate insulating layer 146 is formed over the oxide semiconductor layer 144 (see FIG. 5C).

The oxide semiconductor layer 144 can be formed using the material and the method described in Embodiment 3. Further, the oxide semiconductor layer 144 is preferably subjected to heat treatment (first heat treatment). Embodiment 3 can be referred to for the details.

The gate insulating layer 146 can be formed using the material and the method described in Embodiment 3. After the gate insulating layer 146 is formed, heat treatment (second heat treatment) is preferably performed in an inert gas atmosphere or an oxygen atmosphere. Embodiment 3 can be referred to for the details.

Figure 5D:
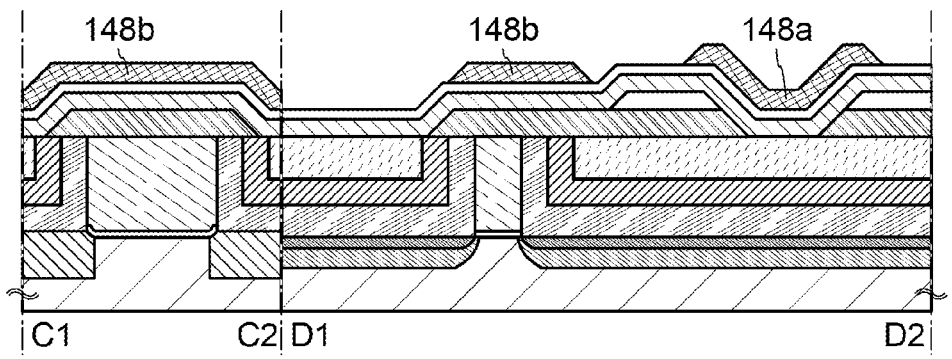

Then, over the gate insulating layer 146, the gate electrode 148a is formed in a region overlapping with a channel formation region of the transistor 162 and the electrode 148b is formed in a region overlapping with the source or drain electrode 142a (see FIG. 5D).

The gate electrode 148a and the electrode 148b can be formed by forming a conductive layer over the gate insulating layer 146 and then selectively etching the conductive layer. The conductive layer to be processed into the gate electrode 148a and the electrode 148b can be formed by a PVD method typified by a sputtering method or a CVD method such as a plasma CVD method. The details are similar to those of the source or drain electrode 142a or the like; thus, description thereof can be referred to.

Figure 6A:
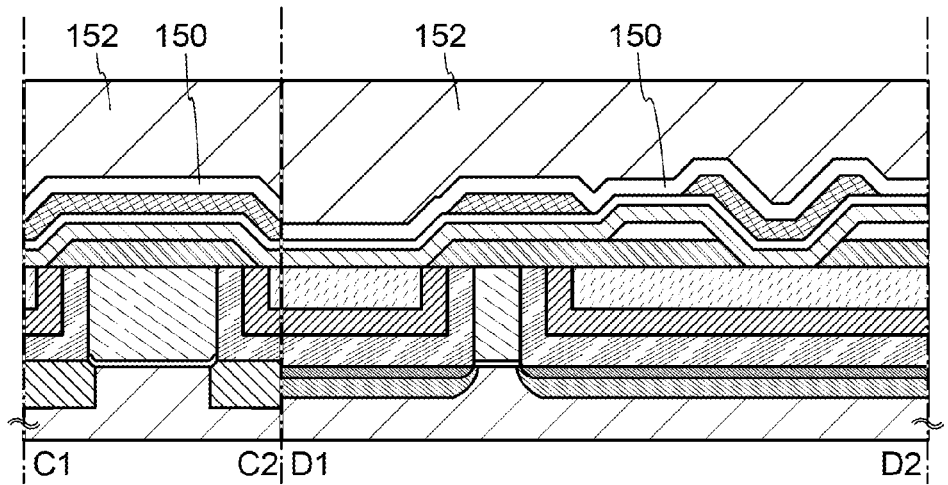
FIGS. 6A to 6C are cross-sectional views of a manufacturing process of a semiconductor device.

Then, the interlayer insulating layer 150 and the interlayer insulating layer 152 are formed over the gate insulating layer 146, the gate electrode 148a, and the electrode 148b (see FIG. 6A). The interlayer insulating layer 150 and the interlayer insulating layer 152 can be formed using materials and methods similar to those described in Embodiment 3. Embodiment 3 can be referred to for the details.

Note that the interlayer insulating layer 152 is preferably formed so as to have a planarized surface. By forming the interlayer insulating layer 152 having a planarized surface, an electrode, a wiring, or the like can be favorably formed over the interlayer insulating layer 152 even in the case where the semiconductor device is miniaturized, for example. The interlayer insulating layer 152 can be planarized by a method such as chemical mechanical polishing (CMP).

Figure 6B:
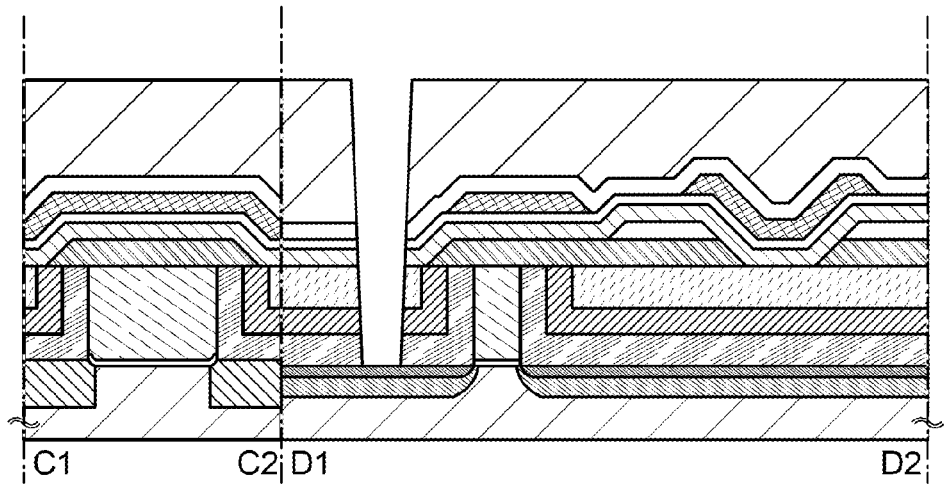
Figure 6C:
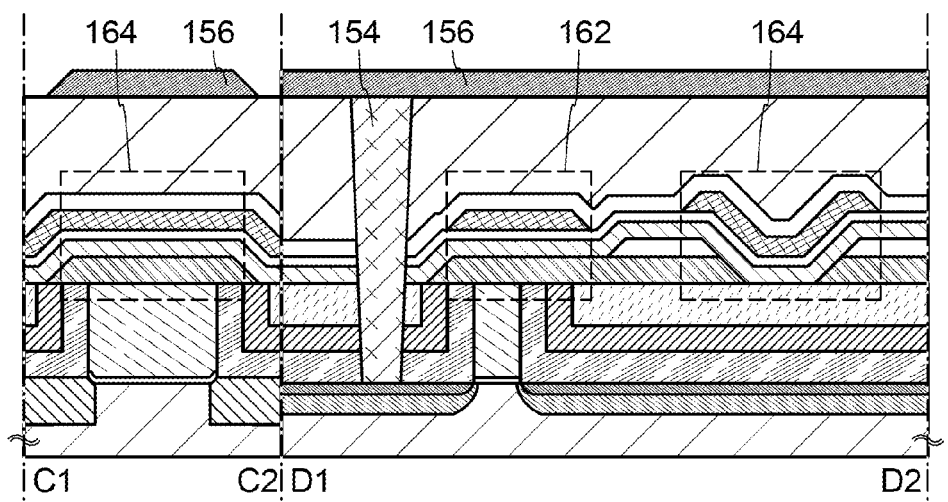

After that, the interlayer insulating layer 125, the interlayer insulating layer 126, the interlayer insulating layer 128, the oxide semiconductor layer 144, the gate insulating layer 146, the interlayer insulating layer 150, and the interlayer insulating layer 152 are selectively etched, whereby an opening that reaches the metal compound region 124 of the transistor 160 is formed (see FIG. 6B). As the etching, either dry etching or wet etching may be used; in terms of microfabrication, dry etching is preferable.

The source or drain electrode 154 is formed so as to fill the opening. Then, the wiring 156 is formed to be connected to the source or drain electrode 154 (see FIG. 6C).

The source or drain electrode 154 can be formed in such a manner that, for example, a conductive layer is formed by a PVD method, a CVD method, or the like in a region including the openings and then part of the conductive layer is removed by etching treatment, CMP, or the like. Specifically, it is possible to employ a method in which, for example, a thin titanium film is formed by a PVD method in a region including the openings, a thin titanium nitride film is formed by a CVD method, and then a tungsten film is formed so as to fill the openings. Here, the titanium film formed by a PVD method has a function of reducing an oxide film (such as a native oxide film) over which the titanium film is to be formed, and thereby lowering contact resistance with lower electrodes or the like (the metal compound regions 124, here). The titanium nitride film formed after the formation of the titanium film has a barrier function of preventing diffusion of the conductive material. A copper film may be formed by a plating method after the formation of the barrier film of titanium, titanium nitride, or the like.

The wiring 156 can be formed in such a manner that a conductive layer is formed in contact with the source or drain electrode 154 and then etched selectively. The conductive layer can be formed by a PVD method typified by a sputtering method or a CVD method such as a plasma CVD method. The details are similar to those of the source or drain electrode 142a or the like.

Through the above steps, the semiconductor device including the transistor 160, the transistor 162, and the capacitor 164 is completed.

The semiconductor device described in this embodiment can be highly integrated because, for example, the transistor 162 and the capacitor 164 overlap with the transistor 160, the transistor 160 does not include a sidewall insulating layer, and the source or drain electrode 142a is formed directly on the gate electrode 110a. Further, the manufacturing process is simplified.

Further, in the semiconductor device described in this embodiment, an insulating layer including hydrogen and an insulating layer with a sufficiently reduced hydrogen concentration are used as the interlayer insulating layer 125 and the interlayer insulating layer 126, respectively; thus, characteristics of the transistors 160 and 162 are improved. In addition, owing to the insulating layers 143a and 143b, so-called gate capacitance is reduced and thus an operating speed of the transistor 162 is increased.

The above features described in this embodiment make it possible to provide a semiconductor device having significantly excellent characteristics.

The structures, methods, and the like described in this embodiment can be combined as appropriate with any of the structures and methods described in the other embodiments.

Embodiment 6

In this embodiment, the case where the semiconductor device described in any of the above embodiments is applied to an electronic device will be described with reference to FIGS. 12A to 12F. In this embodiment, the case where the above semiconductor device is applied to an electronic device such as a computer, a mobile phone (also referred to as a mobile telephone or a mobile telephone device), a portable information terminal (including a portable game console, an audio player, and the like), a digital camera, a digital video camera, an electronic paper, or a television device (also referred to as a television or a television receiver) will be described.

Figure 12A:
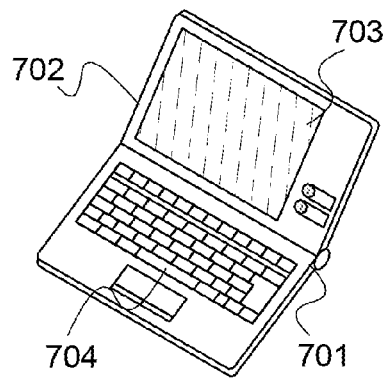
FIGS. 12A to 12F illustrate electronic devices including a semiconductor device.

FIG. 12A is a notebook personal computer including a housing 701, a housing 702, a display portion 703, a keyboard 704, and the like. The semiconductor device described in any of the above embodiments is provided in the housing 701 and the housing 702. Consequently, the notebook personal computer can perform writing and reading data at high speed and store data for a long time with sufficiently reduced power consumption.

Figure 12D:
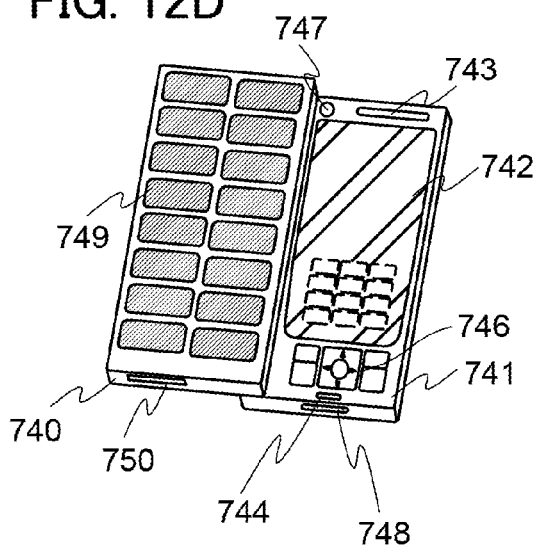
Figure 12B:
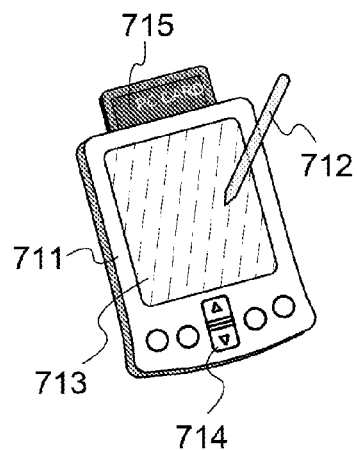

FIG. 12B is a portable information terminal (personal digital assistance (PDA)). A main body 711 is provided with a display portion 713, an external interface 715, operation buttons 714, and the like. Further, a stylus 712 for operating the portable information terminal or the like is also provided. The semiconductor device described in any of the above embodiments is provided in the main body 711. Consequently, the portable information terminal can perform writing and reading data at high speed and store data for a long time with sufficiently reduced power consumption.

Figure 12E:
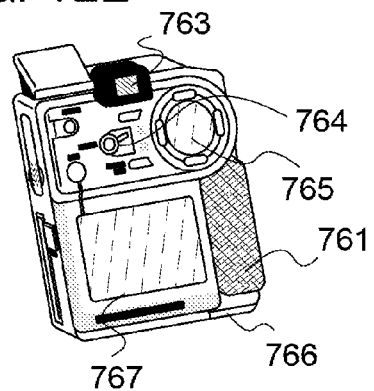
Figure 12C:
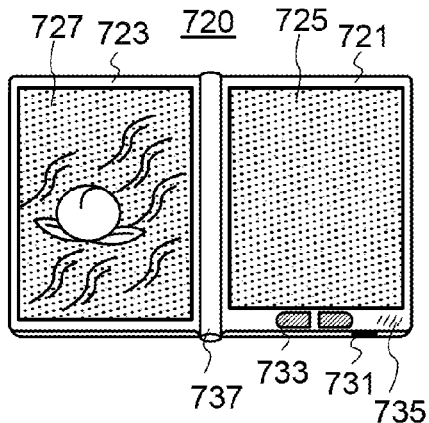

FIG. 12C is an e-book reader 720 mounting an electronic paper. The e-book reader has two housings, a housing 721 and a housing 723. The housing 721 and the housing 723 are provided with a display portion 725 and a display portion 727, respectively. The housing 721 and the housing 723 are connected by a hinge 737 and can be opened and closed along the hinge 737. Further, the housing 721 is provided with a power switch 731, operation keys 733, a speaker 735, and the like. At least one of the housing 721 and the housing 723 is provided with the semiconductor device described in any of the above embodiments. Consequently, the e-book reader can perform writing and reading data at high speed and store data for a long time with sufficiently reduced power consumption.

FIG. 12D is a mobile phone including two housings, a housing 740 and a housing 741. Further, the housing 740 and the housing 741 in a state where they are developed as illustrated in FIG. 12D can shift by sliding so that one is lapped over the other; therefore, the size of the mobile phone can be reduced, which makes the mobile phone suitable for being carried. The housing 741 is provided with a display panel 742, a speaker 743, a microphone 744, a pointing device 746, a camera lens 747, an external connection terminal 748, and the like. The housing 740 is provided with a solar cell 749 that charges the mobile phone, an external memory slot 750, and the like. In addition, an antenna is incorporated in the housing 741. At least one of the housing 740 and the housing 741 is provided with the semiconductor device described in any of the above embodiments. Consequently, the mobile phone can perform writing and reading data at high speed and store data for a long time with sufficiently reduced power consumption.

FIG. 12E is a digital camera including a main body 761, a display portion 767, an eyepiece 763, an operation switch 764, a display portion 765, a battery 766, and the like. The semiconductor device described in any of the above embodiments is provided in the main body 761. Consequently, the digital camera can perform writing and reading data at high speed and store data for a long time with sufficiently reduced power consumption.

Figure 12F:
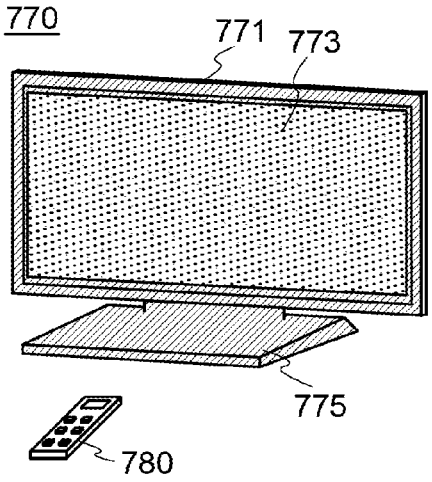

FIG. 12F is a television device 770 including a housing 771, a display portion 773, a stand 775, and the like. The television device 770 can be operated by an operation switch of the housing 771 or a separate remote control 780. The semiconductor device described in any of the above embodiments is mounted in the housing 771 and the remote control 780. Consequently, the television device can perform writing and reading data at high speed and store data for a long time with sufficiently reduced power consumption.

Thus, the semiconductor device according to any of the above embodiments is mounted in the electronic devices described in this embodiment. Accordingly, electronic devices with low power consumption can be realized.

Example 1

The number of times the memory cell according to an embodiment of the disclosed invention can be rewritten was examined. In this example, the examination results will be described with reference to FIGS. 13A and 13B.

A semiconductor device used for the examination is the semiconductor device having the circuit structure in FIG. 1A. Here, an oxide semiconductor was used for a transistor corresponding to the transistor 162. A capacitor with a capacitance value of 0.33 pF was used as a capacitor corresponding to the capacitor 164.

Data was stored and written to the memory cell by applying 0 V or 5 V to a wiring corresponding to the third wiring in FIG. 1A and applying 0 V or 5 V to a wiring corresponding to the fourth wiring. When the potential of the wiring corresponding to the fourth wiring is 0 V, the transistor (the write transistor) corresponding to the transistor 162 is in an off state; thus, a potential applied to the node FG is held. When the potential of the wiring corresponding to the fourth wiring is 5 V, the transistor corresponding to the transistor 162 is in an on state; thus, a potential of the wiring corresponding to the third wiring is applied to the node FG.

Figure 13A:
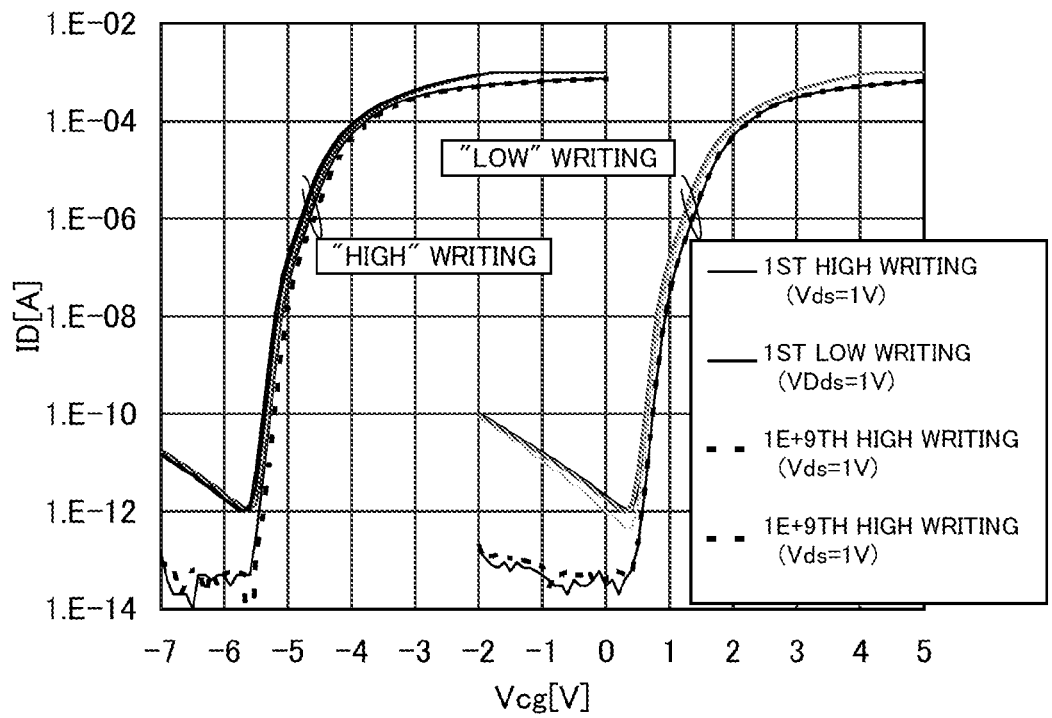
FIGS. 13A and 13B are graphs showing measurement results of a memory window width.
Figure 13B:
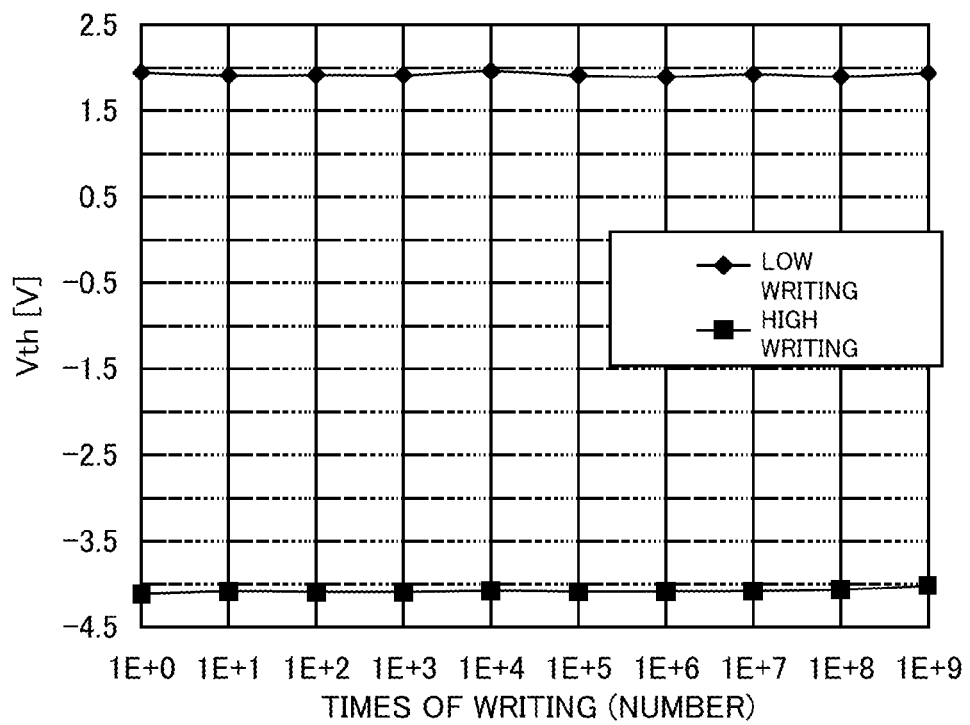

FIG. 13A shows curves (Vcg-Id curves) of the relation between a potential Vcg of a wiring corresponding to the fifth wiring and a drain current Id of a transistor (a read transistor) corresponding to the transistor 160 before and after $1 \times 10^9$ times of writing. In FIGS. 13A and 13B, "L writing" indicates that 0 V is applied to the node FG whereas "H writing" indicates that 5 V is applied to the node FG. Note that in FIG. 13A, the horizontal axis represents Vcg (V) and the vertical axis represents Id (A).

As in FIG. 13A, the Vcg-Id curves of both L writing and H writing hardly change before and after $1 \times 10^9$ times of writing. In addition, the shift amount ($\Delta$Vcg) between the Vcg-Id curve of L writing and the Vcg-Id curve of H writing hardly change before and after $1 \times 10^9$ times of writing.

FIG. 13B illustrates the relation between a potential of the wiring corresponding to the fifth wiring which is needed to turn on the transistor 160 for H writing and L writing, and the number of times of writing. In FIG. 13B, the horizontal axis represents the number of times of rewriting and the vertical axis represents the potential of the wiring corresponding to the fifth wiring, that is, the apparent threshold value $V_{th}$(V) of the transistor 160.

Figure 19:
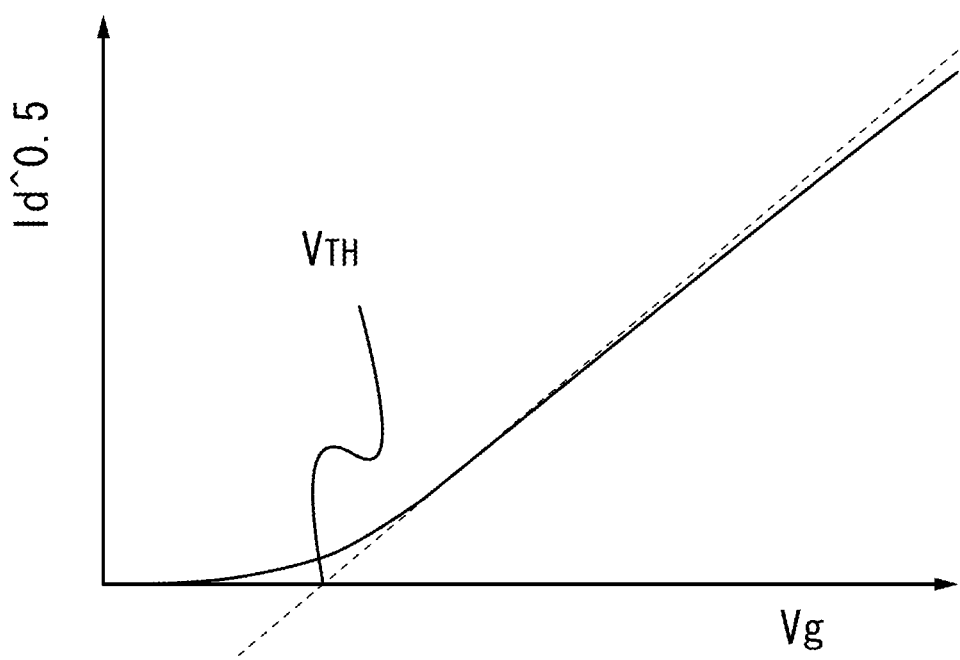
FIG. 19 is a conceptual diagram for showing a method for calculating a threshold value.

Note that the threshold value $V_{th}$ can be generally obtained by the tangent method. Specifically, as in FIG. 19, in the graph where the horizontal axis represents the gate voltage Vg and the vertical axis represents the square root of the drain current Id, the tangent to the point of maximum slope of the curve is obtained. The horizontal axis (the value of the gate voltage Vg) intercept of the tangent is the threshold value $V_{th}$. Also in FIG. 13B, the apparent threshold value $V_{th}$ was obtained by the tangent method.

The memory window widths obtained from FIG. 13B are given in Table 1. Note that the memory window widths, which was obtained by calculation, is the difference between the apparent threshold value $V_{th\_H}$, in the case of H writing and the apparent threshold value $V_{th\_L}$, in the case of L writing.

TABLE 1

| | TIMES OF WRITING | | | | |
|---|---|---|---|---|---|
| | 1.E+00 | 1.E+01 | 1.E+02 | 1.E+03 | 1.E+04 |
| MEMORY WINDOW WIDTH | 6.06 | 6.00 | 6.01 | 6.01 | 6.04 |

| | TIMES OF WRITING | | | | |
|---|---|---|---|---|---|
| | 1.E+05 | 1.E+06 | 1.E+07 | 1.E+08 | 1.E+09 |
| MEMORY WINDOW WIDTH | 6.00 | 5.98 | 6.01 | 5.96 | 5.96 |

As is seen in Table 1, in the memory cell of this example, the memory window width is changed by 2% or less, specifically 1.68%, before and after $1 \times 10^9$ times of writing. The fact that the memory window width is changed by 2% or less by $1 \times 10^9$ times of writing indicates that the semiconductor device does not deteriorate at least during the period in which data is written $1 \times 10^9$ times.

As described above, a memory cell according to an embodiment of the disclosed invention has very high rewriting durability and its characteristics do not change even when data is held and written as much as $10^9$ times. That is, it can be said that a memory cell having excellent reliability and a semiconductor device which includes the memory cell and has excellent reliability is realized according to an embodiment of the disclosed invention.

Example 2

In this example, measurement results of the off-state current of a transistor including a highly purified oxide semiconductor will be described.

Figure 14:
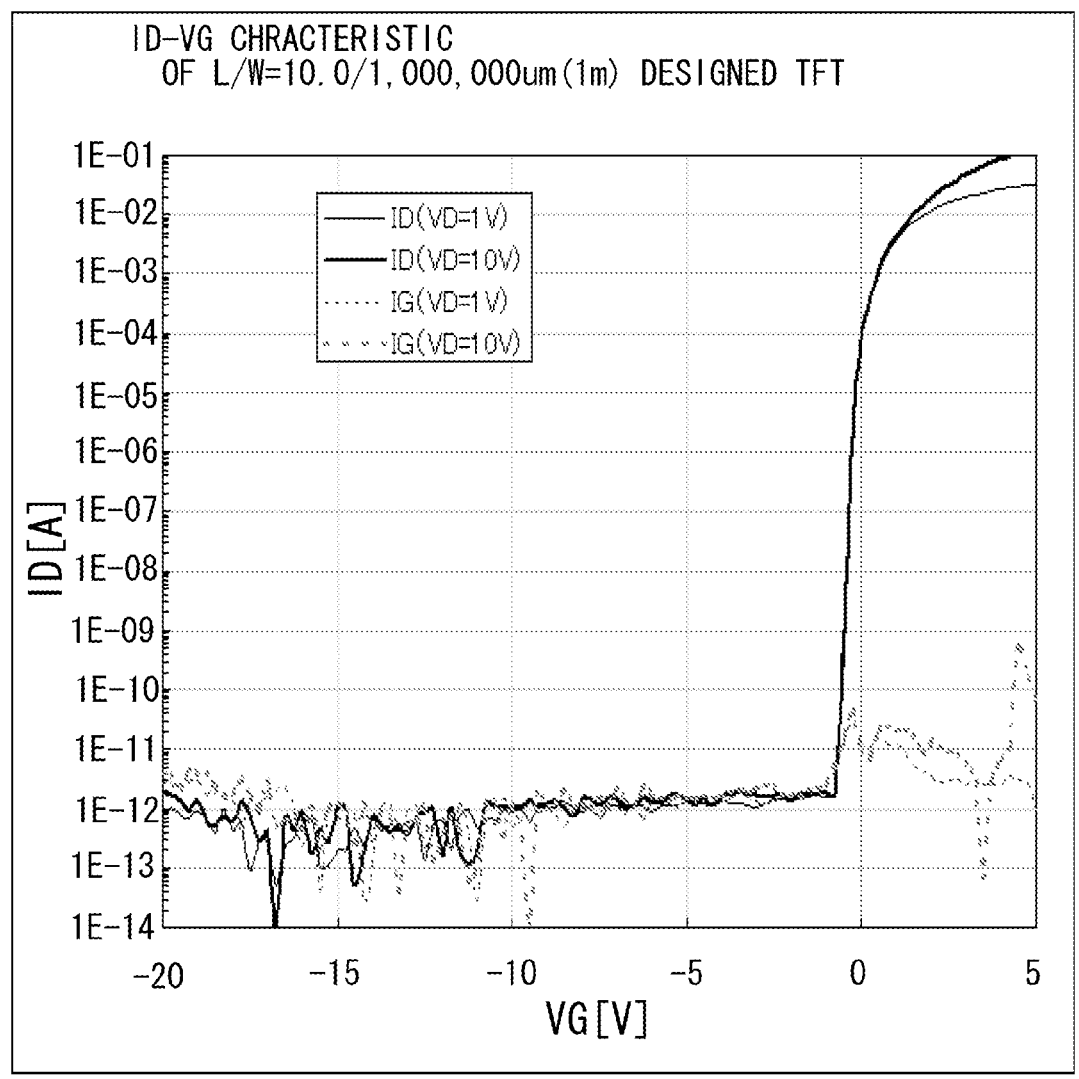
FIG. 14 is a graph showing characteristics of a transistor including an oxide semiconductor.

In this example, a transistor was formed using a highly purified oxide semiconductor as in Embodiment 3. First, a transistor with a channel width W of 1 m, which was sufficiently large, was prepared in consideration of the fact that off-state current of a transistor including a highly purified oxide semiconductor is extremely small, and the off-state current was measured. FIG. 14 shows the results obtained by the measurement of the off-state current of the transistor with a channel width W of 1 m. In FIG. 14, the horizontal axis represents a gate voltage VG and the vertical axis represents a drain current ID. In the case where the drain voltage VD is +1 V or +10 V and the gate voltage VG is within the range of −5 V to −20 V, the off-state current of the transistor was found to be smaller than or equal to $1 \times 10^{-13}$ A, which is the detection limit. In addition, it was found that the off-state current (here, current per micrometer (μm) of channel width) of the transistor is smaller than or equal to 1 aA/μm ($1 \times 10^{-18}$ A/μm).

Described next are the results obtained by more accurately measuring the off-state current of the transistor including a highly purified oxide semiconductor. As described above, the off-state current of the transistor including a highly purified oxide semiconductor was found to be smaller than or equal to $1 \times 10^{-13}$ A, which is the detection limit of the measurement equipment. Here, the results obtained by measuring a more accurate off-state current value (the value smaller than or equal to the detection limit of the measurement equipment in the above measurement), with the use of an element for characteristic evaluation will be described.

First, the element for characteristic evaluation which was used in a method for measuring current will be described with reference to FIG. 15.

Figure 15:
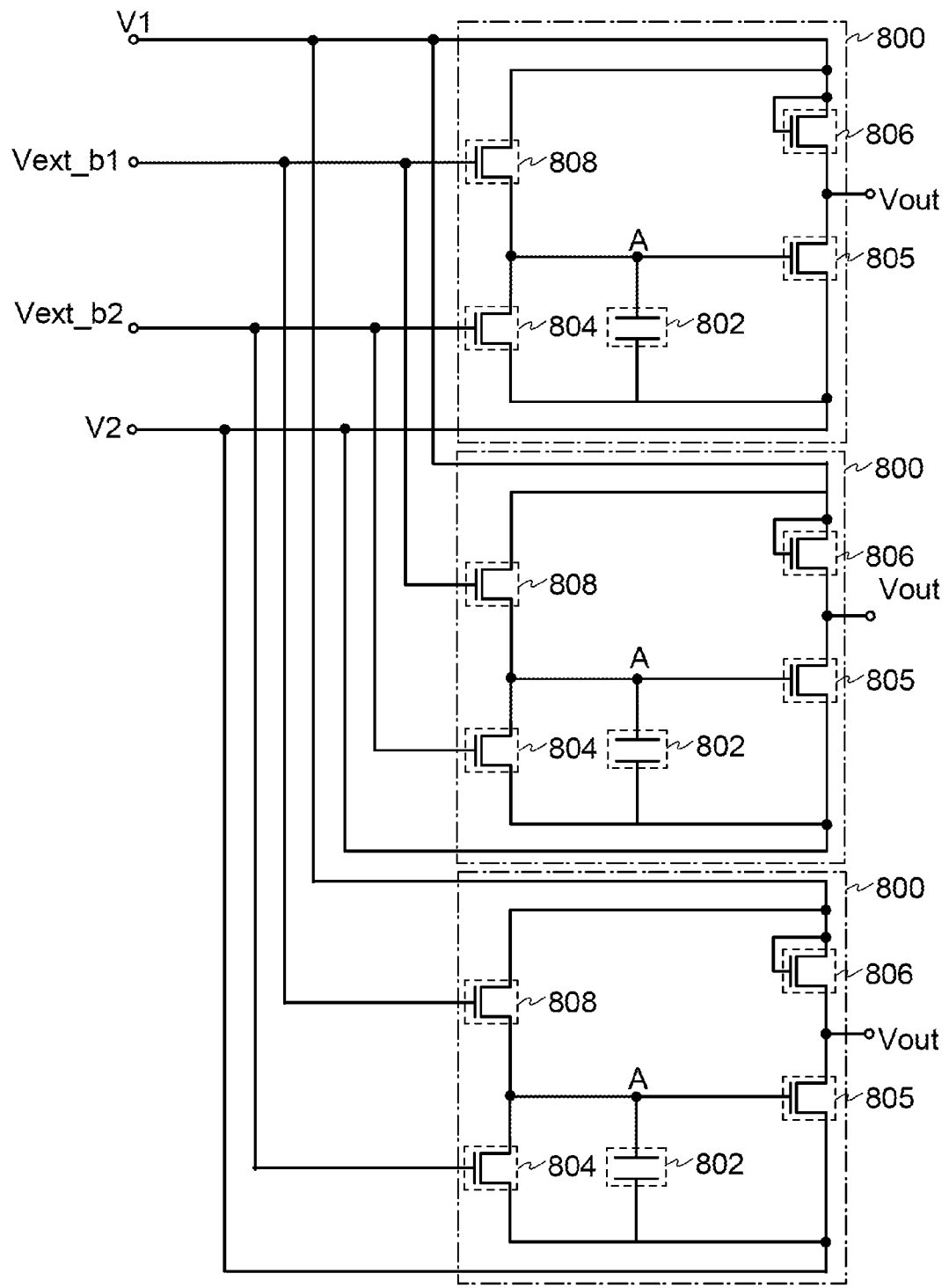
FIG. 15 is a diagram of a circuit for evaluating characteristics of a transistor including an oxide semiconductor.

In the element for characteristic evaluation in FIG. 15, three measurement systems 800 are connected in parallel. The measurement system 800 includes a capacitor 802, a transistor 804, a transistor 805, a transistor 806, and a transistor 808. A transistor formed as in Embodiment 3 was used as each of the transistor 804, the transistor 805, and the transistor 806.

In the measurement system 800, one of a source terminal and a drain terminal of the transistor 804, one terminal of the capacitor 802, and one of a source terminal and a drain terminal of the transistor 805 are connected to a power source (for supplying V2). The other of the source terminal and the drain terminal of the transistor 804, one of a source terminal and a drain terminal of the transistor 808, the other terminal of the capacitor 802, and a gate terminal of the transistor 805 are connected to one another. The other of the source terminal and the drain terminal of the transistor 808, one of a source terminal and a drain terminal of the transistor 806, and a gate terminal of the transistor 806 are connected to a power source (for supplying V1). The other of the source terminal and the drain terminal of the transistor 805 and the other of the source terminal and the drain terminal of the transistor 806 are connected to each other and serve as an output terminal Vout.

A potential Vext_b2 for controlling whether the transistor 804 is an on state or an off state is applied to a gate terminal of the transistor 804. A potential Vext_b1 for controlling whether the transistor 808 is turned on or off is applied to the gate terminal of the transistor 808. A potential Vout is output from the output terminal.

Next, a method for measuring current with the use of the measurement system will be described.

First, an initialization period in which a potential difference is applied to measure the off-state current will be described briefly. In the initialization period, the potential Vext_b1 for turning on the transistor 808 is input to the gate terminal of the transistor 808, and a potential V1 is applied to a node A which is a node connected to the other of the source terminal and the drain terminal of the transistor 804 (that is, the node connected to one of the source terminal and the drain terminal of the transistor 808, the other terminal of the capacitor 802, and the gate terminal of the transistor 805). Here, the potential V1 is, for example, a high potential. The transistor 804 is kept in an off state.

After that, the potential Vext_b1 for turning off the transistor 808 is input to the gate terminal of the transistor 808, whereby the transistor 808 is turned off. After the transistor 808 is turned off, the potential V1 is set to a low potential. The transistor 804 is still in an off state. The potential V2 is set to the same potential as the potential V1. Thus, the initialization period is completed. When the initialization period is completed, a potential difference is generated between the node A and the one of the source electrode and drain electrode of the transistor 804, and a potential difference is also generated between the node A and the other of the source electrode and drain electrode of the transistor 808. Accordingly, a small amount of charge flows through the transistor 804 and the transistor 808. In other words, the off-state current is generated.

Next, a measurement period of the off-state current will be described briefly. In the measurement period, the potential of the one of the source terminal and drain terminal of the transistor 804 (that is, the potential V2) and the potential of the other of the source terminal and drain terminal of the transistor 808 (that is, the potential V1) are fixed to a low potential. On the other hand, the potential of the node A is not fixed (the node A is in a floating state) in the measurement period. Accordingly, charge flows through the transistor 804, and the amount of charge held in the node A changes over time. Further, as the amount of charge held in the node A changes, the potential of the node A changes. In addition, the output potential Vout of the output terminal also changes.

Figure 16:
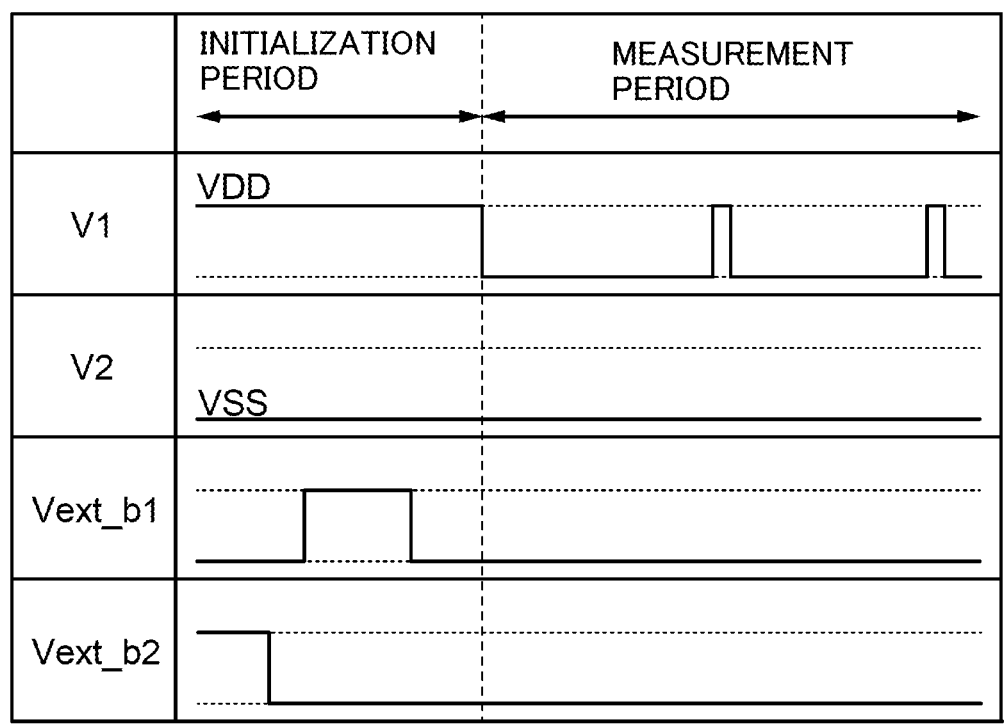
FIG. 16 is a timing diagram of the circuit for evaluating characteristics of a transistor including an oxide semiconductor.

FIG. 16 shows details (a timing diagram) of the relation between potentials in the initialization period in which the potential difference is generated and in the following measurement period.

In the initialization period, first, the potential Vext_b2 is set to a potential (a high potential) at which the transistor 804 is turned on. Thus, the potential of the node A comes to be V2, that is, a low potential (VSS). After that, the potential Vext_b2 is set to a potential (a low potential) at which the transistor 804 is turned off, whereby the transistor 804 is turned off. Then, the potential Vext_b1 is set to a potential (a high potential) at which the transistor 808 is turned on. Thus, the potential of the node A comes to be V1, that is, a high potential (VDD). After that, the potential Vext_b1 is set to a potential at which the transistor 808 is turned off. Thus, the node A is brought into a floating state and the initialization period is completed.

In the following measurement period, the potential V1 and the potential V2 are individually set to potentials at which charge flows to or from the node A. Here, the potential V1 and the potential V2 are set to a low potential (VSS). Note that at the timing of measuring the output potential Vout, it is necessary to operate an output circuit; thus, V1 is set to a high potential (VDD) temporarily in some cases. Note that the period in which V1 is a high potential (VDD) is set to be short so that the measurement is not influenced.

When a potential difference is generated and the measurement period is started as described above, the amount of charge held in the node A changes over time and the potential of the node A changes accordingly. This means that the potential of the gate terminal of the transistor 805 changes and the output potential Vout of the output terminal also changes over time.

A method for calculating the off-state current based on the obtained output potential Vout will be described below.

The relation between the potential $V_A$ of the node A and the output potential Vout is obtained before the off-state current is calculated, whereby the potential $V_A$ of the node A can be obtained based on the output potential Vout. From the relation described above, the potential $V_A$ of the node A can be expressed as a function of the output potential Vout by the following equation.

$$V_A = F(V\text{out}) \qquad \text{[FORMULA 1]}$$

Charge $Q_A$ of the node A is expressed by the following equation, with the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A = C_A V_A + \text{const} \qquad \text{[FORMULA 2]}$$

Since current $I_A$ of the node A is the time derivative of charge flowing to the node A (or charge flowing from the node A), the current $I_A$ of the node A is expressed by the following equation.

$$I_A \equiv \frac{\Delta Q_A}{\Delta t} = \frac{C_A \cdot \Delta F(V\text{out})}{\Delta t} \qquad \text{[Formula 3]}$$

Thus, the current $I_A$ of the node A can be obtained from the capacitance $C_A$ connected to the node A and the output potential Vout of the output terminal.

By the method described above, leakage current (off-state current) flowing between a source and a drain of a transistor which is in an off state can be calculated.

In this example, the transistor 804, the transistor 805, the transistor 806, and the transistor 808 were formed using a highly purified oxide semiconductor with a channel length L of 10 μm and a channel width W of 50 μm. In the measurement systems 800 arranged in parallel, capacitance values of the capacitor 802a, the capacitor 802b, and the capacitor 802c were 100 fF, 1 pF, and 3 pF, respectively.

Note that in the measurement according to this example, VDD was 5 V and VSS was 0 V. In the measurement period, Vout was measured while the potential V1 was basically set to VSS and changed to VDD only for 100 milliseconds every 10 seconds to 300 seconds. Further, Δt used in calculation of current I flowing through the element was approximately 30000 sec.

Figure 17:
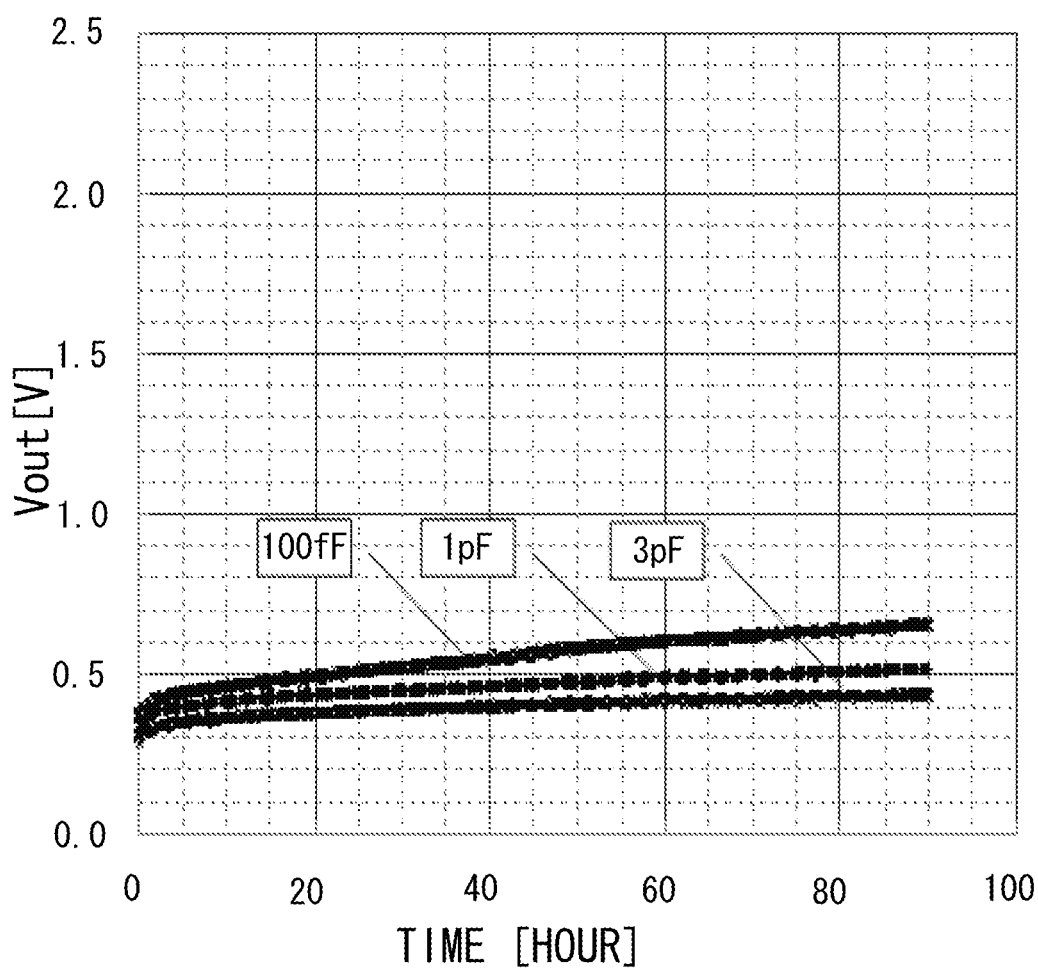
FIG. 17 is a graph showing the characteristics of a transistor including an oxide semiconductor.

FIG. 17 shows the relation between the output potential Vout and elapsed time Time in the current measurement. As is seen in FIG. 17, the potential changes over time.

Figure 18:
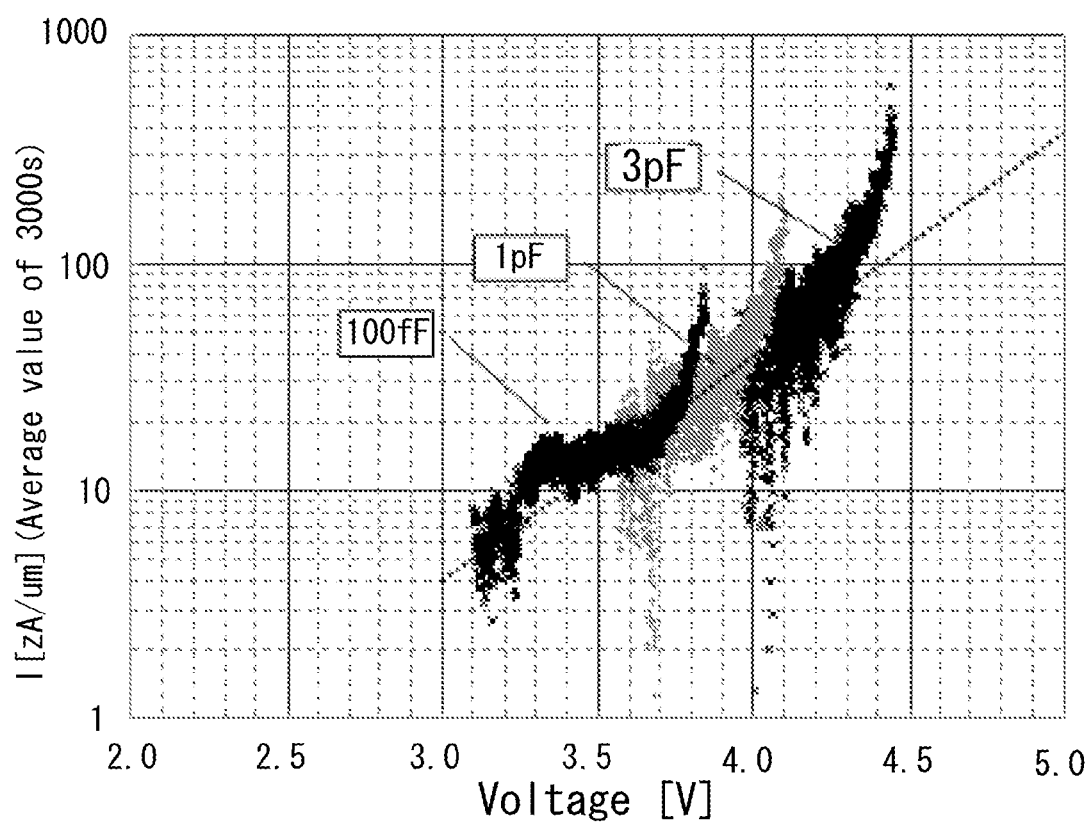
FIG. 18 is a graph showing the characteristics of a transistor including an oxide semiconductor.

FIG. 18 shows the off-state current calculated based on the above current measurement. FIG. 18 shows the relation between a source-drain voltage V and off-state current I. According to FIG. 18, off-state current is approximately 40 zA/μm at room temperature when the source-drain voltage is 4 V. When the source-drain voltage was 3.1 V, the off-state current was smaller than or equal to 10 zA/μm at room temperature. Note that 1 zA is equivalent to $10^{-21}$ A.

According to this example, it was confirmed that the off-state current is sufficiently small in a transistor including a highly purified oxide semiconductor.

This application is based on Japanese Patent Application serial no. 2010-007494 filed with Japan Patent Office on Jan. 15, 2010, the entire contents of which are hereby incorporated by reference.

The invention claimed is:

1. A semiconductor device comprising:
a first transistor comprising a first semiconductor;
a second transistor comprising an oxide semiconductor;
a capacitor; and
a node where one of a source electrode and a drain electrode of the second transistor is connected to a gate electrode of the first transistor and one electrode of the capacitor,
wherein data is written by applying a first potential to the other of the source electrode and the drain electrode of the second transistor when the second transistor are turned on by applying a second potential to a gate electrode of the second transistor,
wherein data is hold at the node when the second transistor is turned off,
wherein data hold at the node is read out by determining whether the first transistor is in an on state or an off state when a third potential is applied to the other electrode of the capacitor, and
wherein a difference between a first threshold voltage of the first transistor in the on state and a second threshold of the first transistor in the off state is kept within 2% or less before and after $1 \times 10^9$ times of writing.

2. A semiconductor device according to claim 1, wherein an off-state current of the second transistor is lower than an off-state current of the first transistor.

3. A semiconductor device according to claim 1, wherein a switching speed of the first transistor is larger than a switching speed of the second transistor.

4. A semiconductor device according to claim 1, wherein an energy gap of the oxide semiconductor is 3 eV or more.

5. A semiconductor device comprising:
a first transistor comprising a first semiconductor;
a second transistor comprising an oxide semiconductor;
wherein an off-state current density of the second transistor is equal to 100 zA/μm or less,
a capacitor; and
a node where one of a source electrode and a drain electrode of the second transistor is connected to a gate electrode of the first transistor and one electrode of the capacitor,
wherein data is written by applying a first potential to the other of the source electrode and the drain electrode of the second transistor when the second transistor are turned on by applying a second potential to a gate electrode of the second transistor,
wherein data is hold at the node when the second transistor is turned off,
wherein data hold at the node is read out by determining whether the first transistor is in an on state or an off state when a third potential is applied to the other electrode of the capacitor, and
wherein a difference between a first threshold voltage of the first transistor in the on state and a second threshold of the first transistor in the off state is kept within 2% or less before and after $1 \times 10^9$ times of writing.

6. A semiconductor device according to claim 5, wherein an off-state current of the second transistor is lower than an off-state current of the first transistor.

7. A semiconductor device according to claim 5, wherein a switching speed of the first transistor is larger than a switching speed of the second transistor.

8. A semiconductor device according to claim 5, wherein an energy gap of the oxide semiconductor is 3 eV or more.

9. A method for using a semiconductor device including a first transistor, a second transistor including an oxide semiconductor, and a capacitor, wherein a gate electrode of the first transistor is connected to one of a source electrode and a drain electrode of the second transistor and one electrode of the capacitor at a node, comprising the step of:
- writing data is written at the node by applying a first potential to the other of the source electrode and the drain electrode of the second transistor while turning on the second transistor by applying a second potential to a gate electrode of the second transistor, and
- reading out data written at the node whether the first transistor is in an on state or an off state when applying a third potential is applied to the other electrode of the capacitor, and
- wherein a difference between a first threshold voltage of the first transistor in the on state and a second threshold voltage of the first transistor in the off state is kept within 2% or less before and after $1\times10^9$ times of writing.

10. A method for using a semiconductor device according to claim 9, wherein an off-state current of the second transistor is lower than an off-state current of the first transistor.

11. A method for using semiconductor device according to claim 9, wherein a switching speed of the first transistor is larger than a switching speed of the second transistor.

12. A method for using a semiconductor device according to claim 9, wherein an energy gap of the oxide semiconductor is 3 eV or more.

13. A method for using a semiconductor device including a first transistor, a second transistor including an oxide semiconductor, and a capacitor, wherein a gate electrode of the first transistor is connected to one of a source electrode and a drain electrode of the second transistor and one electrode of the capacitor at a node, comprising the steps of:
- writing data at the node by applying a first potential to the other of the source electrode and the drain electrode of the second transistor while turning on the second transistor applying a second potential to a gate electrode of the second transistor; and
- reading out data at the node whether the first transistor is in an on state or an off state when applying a third potential to the other electrode of the capacitor,
- wherein a difference between a first threshold voltage of the first transistor in the on state and a second threshold voltage of the first transistor in the off state is kept within 2% or less before and after $1\times10^9$ times of writing, and
- wherein an off-state current density of the second transistor is equal to 100 zA/μm or less.

14. A method for using a semiconductor device according to claim 13, wherein an off-state current of the second transistor is lower than an off-state current of the first transistor.

15. A method for using a semiconductor device according to claim 13, wherein a switching speed of the first transistor is larger than a switching speed of the second transistor.

16. A method for using a semiconductor device according to claim 13, wherein an energy gap of the oxide semiconductor is 3 eV or more.

* * * * *

UNITED STATES PATENT AND TRADEMARK OFFICE
CERTIFICATE OF CORRECTION

PATENT NO. : 8,698,219 B2  Page 1 of 1
APPLICATION NO. : 13/004200
DATED : April 15, 2014
INVENTOR(S) : Yusuke Sekine et al.

It is certified that error appears in the above-identified patent and that said Letters Patent is hereby corrected as shown below:

In the Specification,

Column 4, line 10, replace "perforin" with --perform--;

Column 6, line 35, after "$V_{th\_L}$" delete ",";

Column 7, line 6, after "FG" insert --,--;

Column 17, line 10, replace "of for" with --of, for--;

Column 21, line 30, replace "Y" with --y--;

Column 25, line 35, replace "zA/mm" with --zA/μm--;

Column 36, line 38, after "$V_{th\_H}$" delete ",";

Column 36, line 39, after "$V_{th\_L}$" delete ",";

In the Claims,

Column 41, line 15, in claim 9 after "data" delete "is written";

Column 41, line 20, in claim 9 after "data" delete "written";

Column 41, line 22, in claim 9 after "potential" delete "is applied";

Column 41, line 31, in claim 11 after "using" insert --a--;

Column 42, line 13, in claim 13 after "transistor" insert --by--.

Signed and Sealed this
Thirtieth Day of December, 2014

Michelle K. Lee
*Deputy Director of the United States Patent and Trademark Office*